United States Patent
Yoon et al.

(10) Patent No.: US 10,404,952 B2
(45) Date of Patent: Sep. 3, 2019

(54) IMAGE SENSOR AND SIGNAL PROCESSING METHOD THEREOF

(71) Applicant: Samsung Electronics Co., Ltd., Suwon-si, Gyeonggi-do (KR)

(72) Inventors: Youngkwon Yoon, Seoul (KR); Hwayong Kang, Suwon-si (KR); Dongsoo Kim, Suwon-si (KR); Moonsoo Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 15/211,623

(22) Filed: Jul. 15, 2016

(65) Prior Publication Data

US 2017/0026622 A1 Jan. 26, 2017

(30) Foreign Application Priority Data

Jul. 24, 2015 (KR) .................. 10-2015-0105135

(51) Int. Cl.
| | |
|---|---|
| *H04N 9/04* | (2006.01) |
| *H04N 5/232* | (2006.01) |
| *H04N 5/351* | (2011.01) |
| *H04N 5/369* | (2011.01) |
| *H01L 27/146* | (2006.01) |
| *H04N 5/3745* | (2011.01) |

(52) U.S. Cl.
CPC ....... *H04N 9/045* (2013.01); *H01L 27/14621* (2013.01); *H01L 27/14641* (2013.01); *H04N 5/23212* (2013.01); *H04N 5/351* (2013.01); *H04N 5/3696* (2013.01); *H04N 5/37457* (2013.01); *H04N 9/04555* (2018.08); *H04N 9/04557* (2018.08)

(58) Field of Classification Search
CPC .. H04N 5/3696; H04N 5/37457; H04N 9/045; H01L 27/14627; H01L 27/14641
See application file for complete search history.

(56) References Cited

U.S. PATENT DOCUMENTS

| | | | | |
|---|---|---|---|---|
| 7,821,553 | B2 * | 10/2010 | Ellis-Monaghan | .... H04N 9/045 348/277 |
| 7,990,444 | B2 * | 8/2011 | Kudoh | .............. H01L 27/14603 257/294 |
| 8,547,394 | B2 * | 10/2013 | Swic | ........................ G09G 5/02 345/55 |
| 2006/0146067 | A1 * | 7/2006 | Schweng | ................ H04N 9/045 345/591 |

(Continued)

FOREIGN PATENT DOCUMENTS

| | | |
|---|---|---|
| EP | 1331670 A2 | 7/2003 |
| WO | 2015087515 A2 | 6/2015 |

*Primary Examiner* — Daniel M Pasiewicz
(74) *Attorney, Agent, or Firm* — Jefferson IP Law, LLP

(57) ABSTRACT

An image sensor device and a signal processing method thereof are provided. The image sensor includes a plurality of pixels, and at least one pixel of the plurality of pixels includes a micro lens, a filter which includes a first area for filtering a first color signal from a light signal transmitted through the micro lens, and a second area for filtering a second color signal from the transmitted signal, and a first photodiode for converting the first color signal into an electric signal, and a second photodiode for converting the second color signal into an electric signal.

17 Claims, 27 Drawing Sheets

(56) References Cited

U.S. PATENT DOCUMENTS

| | | |
|---|---|---|
| 2007/0159542 A1 | 7/2007 | Luo |
| 2009/0090841 A1 | 4/2009 | Kusaka |
| 2010/0238330 A1* | 9/2010 | Hirota ............... H01L 27/14621 348/273 |
| 2012/0268566 A1* | 10/2012 | Kim .................... H04N 5/3696 348/46 |
| 2013/0070140 A1* | 3/2013 | Gove ................... G02B 3/0056 348/302 |
| 2013/0242149 A1 | 9/2013 | Terai et al. |
| 2014/0139716 A1 | 5/2014 | Sasaki et al. |
| 2014/0184863 A1* | 7/2014 | Tu ........................... H04N 9/07 348/280 |
| 2014/0232900 A1* | 8/2014 | Wernersson ......... H04N 5/2251 348/223.1 |
| 2014/0320735 A1 | 10/2014 | Ikedo |
| 2015/0054997 A1* | 2/2015 | Hynecek ........... H01L 27/14643 348/302 |
| 2017/0171470 A1* | 6/2017 | Sakioka ............ H01L 27/14627 |

* cited by examiner

IMAGE SENSOR AND SIGNAL PROCESSING METHOD THEREOF

CROSS-REFERENCE TO RELATED APPLICATION(S)

This application claims the benefit under 35 U.S.C. § 119 of a Korean patent application filed on Jul. 24, 2015 in the Korean Intellectual Property Office and assigned Serial number 10-2015-0105135, the entire disclosure of which are hereby incorporated by reference.

TECHNICAL FIELD

The present disclosure relates to an image sensor, and for example, to a configuration of an image sensor and a signal processing method thereof.

BACKGROUND

The image sensor is an element which converts an optical image into an electric signal. Thanks to the development of the computer industry and the communication industry, the demand for an image sensor having improved performance is increasing in various fields such as digital cameras, camcorders, personal communication systems (PCSs), game devices, security service cameras, medical micro cameras, robots, etc.

The image sensor may include a color filter. The image sensor may detect light corresponding to a specific wavelength through the color filter. For example, the image sensor may detect light corresponding to a red wavelength through a red filter. In addition, the image sensor may detect light corresponding to a blue wavelength through a blue filter.

A single pixel of the image sensor may include a micro lens, a single color filter, and a photodiode corresponding to the single color filter. Accordingly, light passing through the micro lens may be converted into light having a specific wavelength through the color filter, and then may be delivered to the photodiode. Through this process, light having wavelengths different from the specific wavelength may be blocked by the color filter and thus may not be delivered to the photodiode. Therefore, the sensitivity of light may deteriorate in the photodiode in part.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a pixel structure of an image sensor which can receive light of various wavelengths.

Another aspect of the present disclosure is to provide a pixel structure of an image sensor which can provide a clear image when a background for photographing has low illumination.

In accordance with an aspect of the present disclosure, an image sensor is provided. The image sensor includes a plurality of pixels, wherein at least one pixel of the plurality of pixels includes a micro lens, a filter wherein the filter includes a first area for filtering a first color signal from a light signal transmitted through the micro lens, and a second area for filtering a second color signal from the transmitted signal, a first photodiode for converting the first color signal into an electric signal, and a second photodiode for converting the second color signal into an electric signal.

In accordance with another aspect of the present disclosure, an electronic device is provided. The electronic device includes an image sensor including a plurality of pixels, and a processor functionally connected with the image sensor, wherein at least one pixel of the plurality of pixels includes a micro lens, a filter wherein the filter includes a first area for filtering a first color signal from a light signal transmitted through the micro lens, and a second area for filtering a second color signal from the transmitted signal, and the electronic device further includes a first photodiode for converting the first color signal into an electric signal, and a second photodiode for converting the second color signal into an electric signal, and wherein the processor is configured to generate brightness information and color information based on at least the first color signal and the second color signal which are converted into the electric signals, and output an image corresponding to the brightness information and the color information.

In accordance with another aspect of the present disclosure, a signal processing method is provided. The signal processing method includes receiving a light signal through a single micro lens included in at least one pixel included in an image sensor, filtering a white signal and a color signal from the light signal through a filter including a first area and a second area; converting the white signal and the color signal into electric signals through a plurality of photodiodes, and outputting an image corresponding to brightness information and color information which are determined based on the electric signals through a display.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 8A and 8B illustrate views showing a pixel structure of an image sensor according to an embodiment of the present disclosure;

Throughout the drawings, it should be noted that like reference numbers are used to depict the same or similar elements, features, and structures.

DETAILED DESCRIPTION

Figure 1:
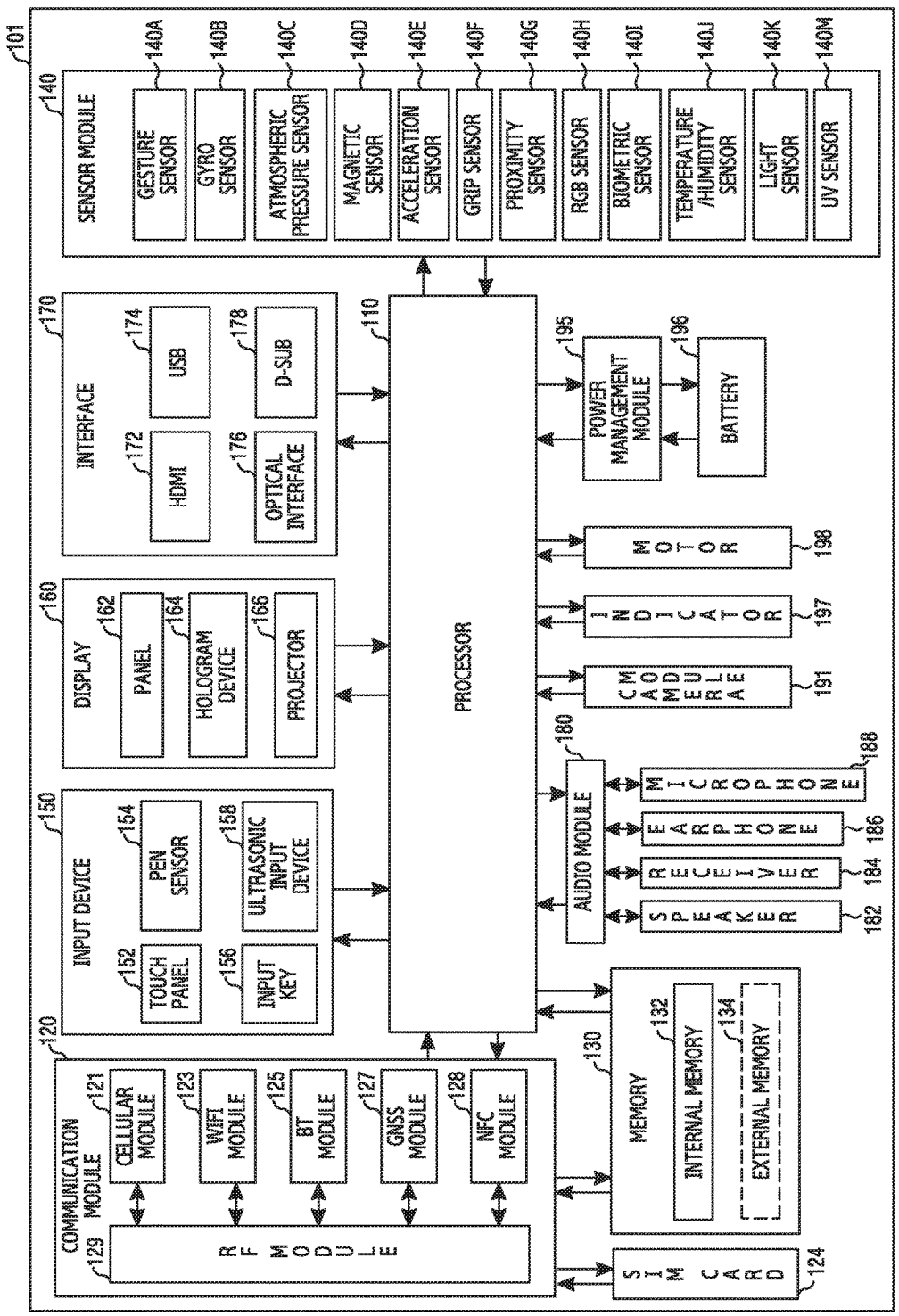
FIG. 1 illustrates a block diagram of an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expression "have", "may have", "include" or "may include" refers to existence of a corresponding feature (e.g., numerical value, function, operation, or components such as elements), and does not exclude existence of additional features.

In the present disclosure, the expression "A or B," "at least one of A or/and B," or "one or more of A or/and B" may include all possible combinations of the items listed. For example, the expression "A or B," "at least one of A and B," or "at least one of A or B" refers to all of (1) including at least one A, (2) including at least one B, or (3) including all of at least one A and at least one B.

The expression "a first," "a second," "the first," or "the second" used in various embodiments of the present disclosure may modify various components regardless of the order and/or the importance but does not limit the corresponding components. For example, a first electronic device and a second electronic device may indicate different user devices, regardless of order or importance thereof. For example, a first element may be interchangeably referred to as a second element, and similarly, a second element may be interchangeably referred to as a first element without departing from the scope of the present disclosure.

It should be understood that when an element (e.g., a first element) is referred to as being (operatively or communicatively) "connected" or "coupled" to another element (e.g., second element), it may be directly connected or coupled directly to the other element. In such a situation, alternatively, any other element (e.g., third element) may be interposed between them. In certain embodiments of the present disclosure, it may be understood that when an element (e.g., first element) is referred to as being "directly connected," or "directly coupled" to another element (second element), there are no element (e.g., third element) interposed between them (while there can be a connecting element, such as an adhesive or a connector between them).

The expression "configured to" used in the present disclosure may be interchangeably used with, for example, "suitable for," "having the capacity to," "designed to," "adapted to," "made to," or "capable of," depending on the context. The term "configured to" may not necessarily imply "specifically designed to" in hardware. Alternatively, in some situations, the expression "device configured to" may mean that the device, together with other devices or components, "is able to." For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments of the present disclosure, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments of the present disclosure, the electronic device may be a home appliance. The home appliance may, for example, include at least one of a television, a digital versatile disc (DVD) player, an audio player, a refrigerator, an air conditioner, a cleaner, an oven, a microwave oven, a washing machine, an air purifier, a set-top box, a home automation control panel, a television (TV) box (e.g., HomeSync™ of Samsung, Apple TV™, or Google TV™), a game console (e.g., Xbox™, PlayStation™), an electronic dictionary, an electronic key, a camcorder, and an electronic frame.

According to another embodiment of the present disclosure, the electronic device may include at least one of various medical devices (e.g., various portable medical measuring devices (a blood glucose measuring device, a heart rate measuring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global navigation satellite system (GNSS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments of the present disclosure, the electronic device may include at least one of a part of furniture or a building/structure, an electronic board, an electronic signature-receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a block diagram of an electronic device according to an embodiment of the present disclosure.

Referring to FIG. 1, the electronic device 101 may include an AP 110, a communication module 120, a subscriber identification module (SIM) card 124, a memory 130, a sensor module 140, an input device 150, a display 160, an interface 170, an audio module 180, a camera module 191, a power management module 195, a battery 196, an indicator 197, or a motor 198.

The processor 110 may run an operating system or an application program to control a plurality of hardware or software constituent elements connected to the processor 110, and may perform processing and operation of various data including multimedia data. The processor 110 may be, for example, implemented as a system on chip (SoC). According to an embodiment of the present disclosure, the processor 110 may further include a graphical processing unit (GPU) (not shown). The processor 110 may further includes at least one of other constitute elements (ex: the cellular module 121) drown in FIG. 1. The processor 110 may load an instruction or data, which is received from a non-volatile memory connected to each or at least one of other constituent elements, to a volatile memory and process the loaded instruction or data. In addition, the processor 110 may store in the non-volatile memory data, which is received from at least one of the other constituent elements or is generated by at least one of the other constituent elements. According to an embodiment of the present disclosure, the processor 110 may be referred to as a controller.

According to an embodiment of the present disclosure, the processor 110 may receive color information from an image sensor (not shown) included in the camera module 191. For example, the color information may include brightness information and primary color information (or color information). For example, the brightness information may be information on light which is filtered through a transparent filter area of a light filter of the image sensor (not shown).

According to an embodiment of the present disclosure, thereafter, the processor 110 may convert the received color information into a YUV signal, store the YUV signal in the memory 130 or convert the YUV signal into a red, green, blue (RGB) signal, and display the RGB signal on the display 160.

According to another embodiment of the present disclosure, the processor 110 may receive the brightness information from the image sensor (not shown). For example, the processor 110 may detect a phase difference of light using the brightness information, and may move the lens of the camera module 191 to adjust the focus of the camera module 191 based on the detected phase difference.

According to an embodiment of the present disclosure, the communication module 120 may include a cellular module 121, a Wi-Fi module 123, a Bluetooth (BT) module 125, a GNSS module 127 (ex: a global positioning system (GPS)) module, a glonass module, a beidou module, or a Galileo module), a near field communication (NFC) module 128, and a radio frequency (RF) module 129.

The cellular module 121 may provide a voice telephony, a video telephony, a text service, an Internet service, and the like, through a telecommunication network (e.g., long term evolution (LTE), LTE-advance (LTE-A), code division multiple access (CDMA), wideband CDMA (WCDMA), universal mobile telecommunications system (UMTS), wireless broadband (WiBro), global system for mobile (GSM), and the like). In addition, the cellular module 121 may, for example, use a SIM (e.g., the SIM card 124) to perform electronic device distinction and authorization within the telecommunication network. According to an embodiment of the present disclosure, the cellular module 121 may perform at least some of functions that the AP 110 may provide. For example, the cellular module 121 may include a communication processor (CP).

The Wi-Fi module 123, the BT module 125, the GPS module 127 or the NFC module 128 each may include, for example, a processor for processing data transmitted/received through the corresponding module. According to an embodiment of the present disclosure, at least some (e.g., two or more) of the cellular module 121, the Wi-Fi module 123, the BT module 125, the GPS module 127 or the NFC module 128 may be included within one integrated circuit (IC) or IC package.

The RF module 129 may perform transmission/reception of data, for example, transmission/reception of an RF signal. Though not illustrated, the RF module 129 may include, for example, a transceiver, a power amplifier module (PAM), a frequency filter, a low noise amplifier (LNA), an antenna and the like. According to an embodiment of the present disclosure, at least one of the cellular module 121, the Wi-Fi module 123, the BT module 125, the GPS module 127 or the NFC module 128 may perform transmission/reception of a radio frequency (RF) signal through a separate RF module.

The SIM card 124 may be a card including a SIM, and may be inserted into a slot provided in a specific position of the electronic device 101. The SIM card 124 may include unique identification information (e.g., an integrated circuit card ID (ICCID)) or subscriber information (e.g., an international mobile subscriber identity (IMSI)).

The memory 130 may include an internal memory 132 or an external memory 134. The internal memory 132 may include, for example, at least one of a volatile memory (e.g., a dynamic random access memory (DRAM), a static RANI (SRAM) and a synchronous DRAM (SDRAM)) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory).

According to an embodiment of the present disclosure, the internal memory 132 may be a solid state drive (SSD). The external memory 134 may further include a flash drive, for example, compact flash (CF), secure digital (SD), micro-SD, mini-SD, extreme digital (xD), a memory stick, and the like. The external memory 134 may be operatively connected with the electronic device 101 through various interfaces.

The sensor module 140 may measure a physical quantity or detect an activation state of the electronic device 101, and convert measured or detected information into an electric signal. The sensor module 140 may include, for example, at least one of a gesture sensor 140A, a gyro sensor 140B, an air pressure sensor 140C, a magnetic sensor 140D, an acceleration sensor 140E, a grip sensor 140F, a proximity sensor 140G a color sensor 140H (e.g., a RGB sensor), a bio-physical sensor 140I, a temperature/humidity sensor 140J, an illumination sensor 140K, a ultraviolet (UV) sensor 140M, and the like. Additionally or alternatively, the sensor module 140 may include, for example, an E-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), a fingerprint sensor (not shown), and the like. The sensor module 140 may further include a control circuit for controlling at least one or more sensors belonging therein. In various embodiments of the present disclosure, an electronic device 101 may further include a processor configured to control the sensor module 140 as a part of or separately from the processor 110, and may control the sensor module 140 while the processor 110 is in a sleep state.

The input device 150 may include a touch panel 152, a (digital) pen sensor 154, an input key 156, an ultrasonic input device 158, and the like. The touch panel 152 may, for example, detect a touch input in at least one of a capacitive overlay scheme, a pressure sensitive scheme, an infrared beam scheme, or an acoustic wave scheme. In addition, the touch panel 152 may further include a control circuit as well. In a case of the capacitive overlay scheme, physical contact or proximity detection is possible. The touch panel 152 may further include a tactile layer as well. In this case, the touch panel 152 may provide a tactile response to a user.

The (digital) pen sensor 154 may be implemented in the same or similar method to receiving a user's touch input or by using a separate sheet for detection. The input key 156 may include, for example, a physical button, an optical key, or a keypad. The ultrasonic input device 158 is a device capable of identifying data by detecting a sound wave in the electronic device 101 through an input tool generating an ultrasonic signal, and enables wireless detection.

The display 160 (e.g., the display 160) may include a panel 162, a hologram device 164, or a projector 166. The panel 162 may be, for example, a liquid crystal display (LCD), an active-matrix organic light emitting diode (AMO-LED), and the like. The panel 162 may be, for example, implemented to be flexible, transparent, or wearable. The panel 162 may be constructed as one module along with the touch panel 152 as well. The hologram device 164 may use interference of light to show a three-dimensional image in the air. The projector 166 may project light to a screen to display an image. The screen may be, for example, located inside or outside the electronic device 101. According to an embodiment of the present disclosure, the display 160 may further include a control circuit for controlling the panel 162, the hologram device 164, or the projector 166.

The interface 170 may include, for example, a high definition multimedia interface (HDMI) 172, a universal serial bus (USB) 174, an optical interface 176, or a D-sub-miniature (D-sub) 178. Additionally or alternatively, the interface 170 may include, for example, a mobile high-definition link (MHL) interface, an SD card/multimedia card (MMC) interface or an infrared data association (IrDA) standard interface.

The audio module 180 may convert a voice and an electric signal interactively. The audio module 180 may, for example, process sound information which is inputted or outputted through a speaker 182, a receiver 184, an earphone 186, the microphone 188, and the like.

The camera module 191 is a device able to take a still picture and a moving picture. According to an embodiment of the present disclosure, the camera module 191 may include one or more image sensors (e.g., a front sensor or a rear sensor), a lens (not shown), an image signal processor (ISP) (not shown), or a flash (not shown) (e.g., an LED or a xenon lamp).

The power management module 195 may manage electric power of the electronic device 101. Though not illustrated, the power management module 195 may include, for example, a power management integrated circuit (PMIC), a charger IC, a battery, a fuel gauge, and the like.

The PMIC may be, for example, mounted within an IC or a SoC semiconductor. A charging scheme may be divided into a wired charging scheme and a wireless charging scheme. The charger IC may charge the battery 296, and may prevent the inflow of overvoltage or overcurrent from an electric charger. According to an embodiment of the present disclosure, the charger IC may include a charger IC for at least one of the wired charging scheme or the wireless charging scheme. The wireless charging scheme may, for example, be a magnetic resonance scheme, a magnetic induction scheme, an electromagnetic wave scheme, and the like. A supplementary circuit for wireless charging, for example, a circuit, such as a coil loop, a resonance circuit, a rectifier, and the like, may be added.

The indicator 197 may display a specific status of the electronic device 101 or one part (e.g., the processor 110) thereof, for example a booting state, a message state, a charging state, and the like. The motor 198 may convert an electric signal into a mechanical vibration. Though not illustrated, the electronic device 101 may include a processing device (e.g., a GPU) for mobile TV support. The processing device for mobile TV support may, for example, process media data according to the standards of digital multimedia broadcasting (DMB), digital video broadcasting (DVB), a media flow, and the like.

Each of the above-described elements of the electronic device according to various embodiments of the present disclosure may include one or more components, and the name of a corresponding element may vary according to the type of electronic device. The electronic device according to various embodiments of the present disclosure may include at least one of the above-described elements and may exclude some of the elements or further include other additional elements. Further, some of the elements of the electronic device according to various embodiments of the present disclosure may be coupled to form a single entity while performing the same functions as those of the corresponding elements before the coupling.

Figure 2A:
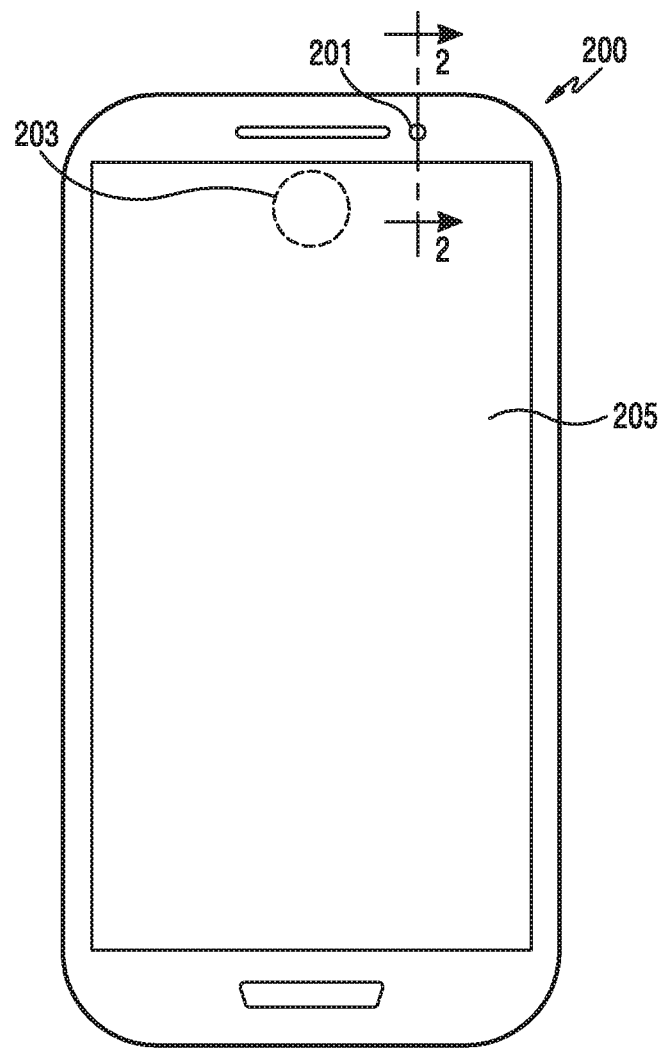
FIG. 2A illustrates a front view of an electronic device according to an embodiment of the present disclosure.

FIG. 2A illustrates a front view of an electronic device according to an embodiment of the present disclosure.

Referring to FIG. 2A, according to an embodiment of the present disclosure, the electronic device 200 may include a front camera module 201, a rear camera module 203, and a display 205.

According to an embodiment of the present disclosure, the front camera module 201 may be provided on the front surface of the electronic device 200, and may photograph a still image and a moving image regarding a subject located in front of the electronic device 200. The rear camera module 203 may be provided on the rear surface of the electronic device 200, and may photograph a still image or a moving image regarding a subject located behind the electronic device 200.

According to an embodiment of the present disclosure, the display 205 may output a still image or a moving image under the control of the processor 110. For example, the display 205 may output the moving image inputted from the front camera module 201 or the rear camera module 203 in the form of a preview screen.

Figure 2B:
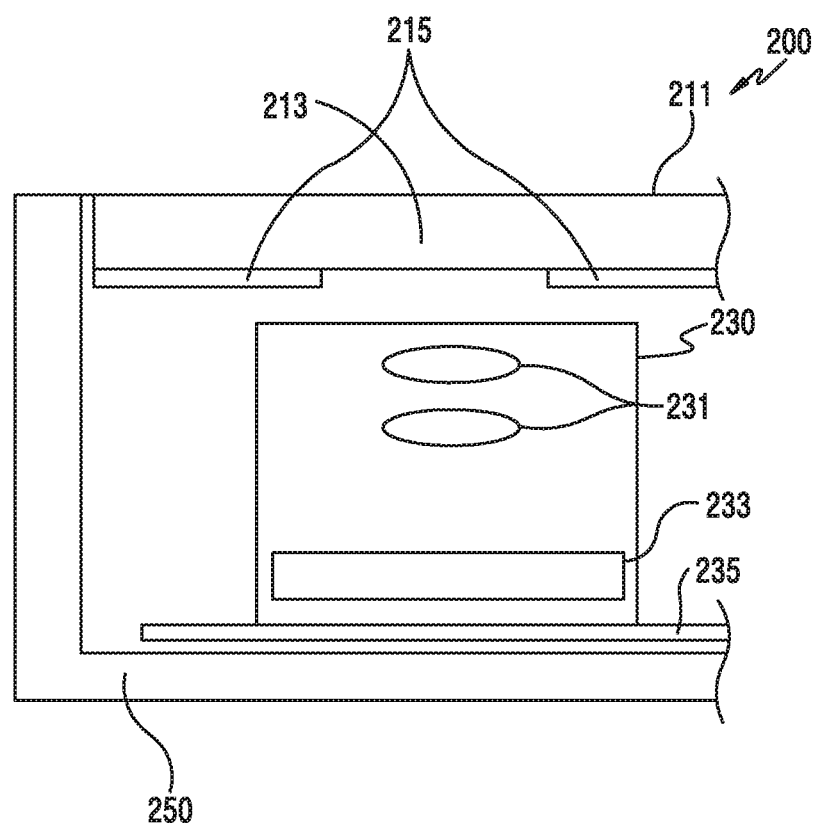
FIG. 2B illustrates a view showing a cross section of an electronic device according to an embodiment of the present disclosure.

FIG. 2B illustrates a view showing a cross section of an electronic device according to an embodiment of the present disclosure. According to an embodiment of the present disclosure, FIG. 2B is a cross section view taken along line 2-2 of FIG. 2A.

Referring to FIG. 2B, according to an embodiment of the present disclosure, the electronic device 200 may include a front cover 211 (for example, glass), an opaque layer 215, a front camera module 230, a circuit board 235, a rear cover. According to an embodiment of the present disclosure, the front cover 211 may include an opening 213. For example, the opening 213 may be an area for receiving light there through.

According to an embodiment of the present disclosure, the front camera module 230 may include one or more lenses 231 and an image sensor 233. According to an embodiment of the present disclosure, light entering through the opening 213 may be inputted to the image sensor 233 through the one or more lenses 231. The image sensor 233 may convert the incoming light (for example, a white signal or a color signal) into an electric signal.

Figure 3:
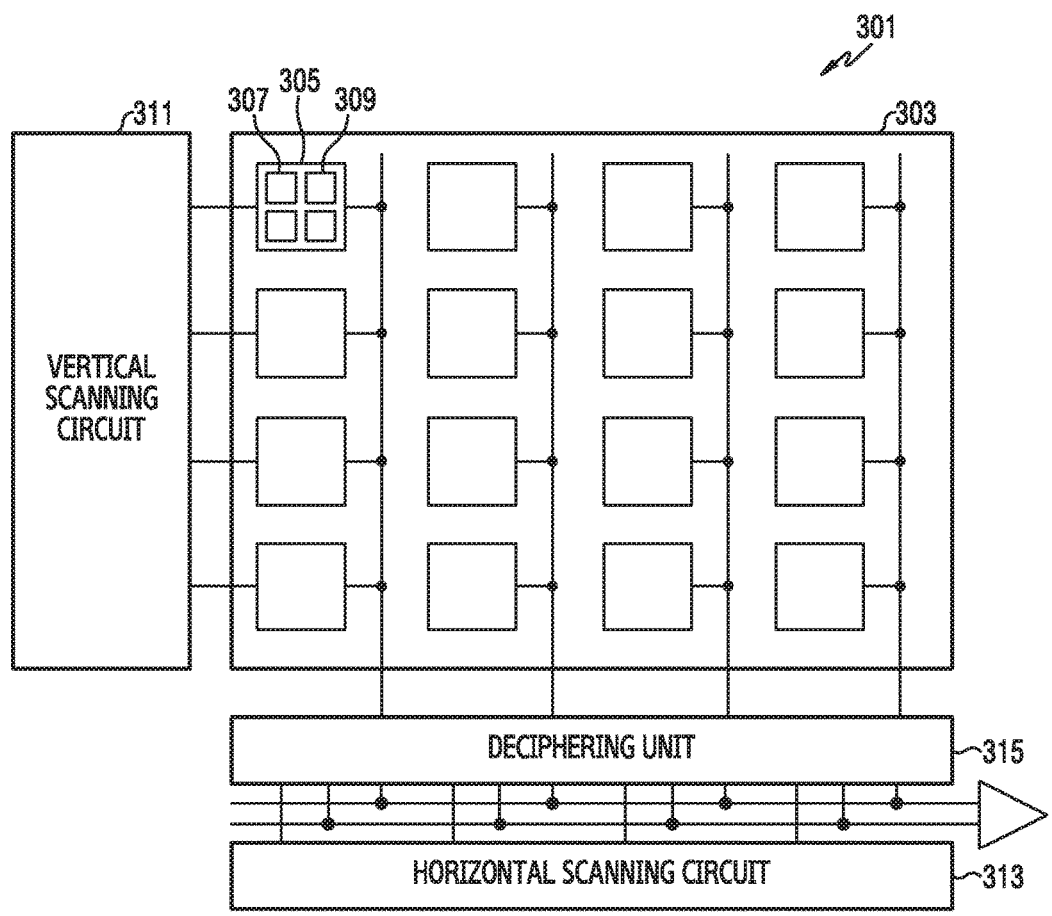
FIG. 3 illustrates a block diagram of an image sensor according to an embodiment of the present disclosure.

FIG. 3 illustrates a block diagram of an image sensor according to an embodiment of the present disclosure.

Referring to FIG. 3, according to an embodiment of the present disclosure, the image sensor 301 may include a pixel structure 303 including a plurality of pixels, a vertical scanning circuit 311, a horizontal scanning circuit 313, and a deciphering unit 315.

According to an embodiment of the present disclosure, a single pixel 305 included in the pixel structure 303 may include a single micro lens, a filter, and a plurality of photodiodes 307, 309. For example, the filter may include a white filter area and a color filter area. According to an embodiment of the present disclosure, the vertical scanning circuit 311 and the horizontal scanning circuit 313 may detect signals (for example, white color signals or color signals) of the plurality of photodiodes under the control of the processor 110 or an ISP. According to an embodiment of the present disclosure, the deciphering unit 315 may read out the detected signals.

Figure 4:
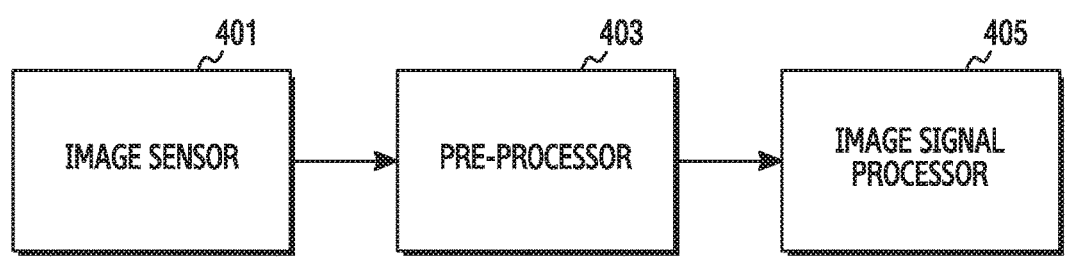
FIG. 4 illustrates a block diagram of a camera module according to an embodiment of the present disclosure.

FIG. 4 illustrates a block diagram of a camera module according to an embodiment of the present disclosure.

Figure 5:
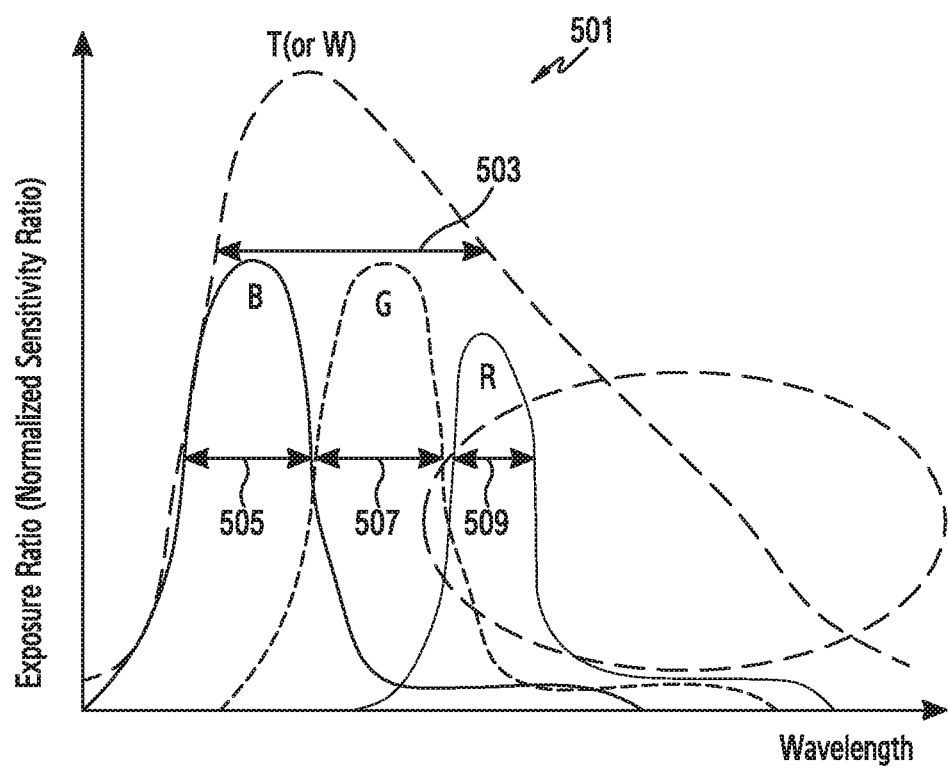
FIG. 5 illustrates a graph showing a sensitivity ratio of each color according to an embodiment of the present disclosure.

FIG. 5 illustrates a graph showing a sensitivity ratio of each color according to an embodiment of the present disclosure.

Referring to FIG. 4, according to an embodiment of the present disclosure, the camera module (for example, the camera module 191) may include an image sensor 401, a pre-processor 403, and an ISP 405. In explaining the elements in detail, according to an embodiment of the present disclosure, the image sensor 401 may convert light (for example, a white signal or a color signal) entering through a lens (for example, the lens 231) of the camera module into an electric signal. For example, the image sensor 401 may transmit a red, green, blue and white (RGBW) signal to the pre-processor 403. For example, the RGBW signal (for example, the white signal or the color signal) may refer to a signal which is outputted from a first diode corresponding to a white filter area included in a light filter, a second diode corresponding to a red filter area, a third diode corresponding to a green filter area, and a fourth diode corresponding to a blue filter area.

According to an embodiment of the present disclosure, the pre-processor 403 may be configured as a single independent IC chip or may be included in at least one of the image sensor 401 and the ISP 405. For example, the pre-processor 403 may perform a bad pixel correction (BPC) or reconstruction function. According to an embodiment of the present disclosure, the pre-processor 403 may receive a digital signal from the image sensor 401, convert the received digital signal into a YUV signal, or transmit the YUV signal to the ISP 405.

According to an embodiment of the present disclosure, the pre-processor 403 may receive the RGBW signal and convert the received RGBW signal into a YUV signal. For example, the pre-processor 403 may generate the YUV signal using the T or W components included in the RGBW signal.

For example, the YUV signal may be influenced by the sensitivity of a white filter area and a primary color filter area.

Referring to FIG. 5, the sensitivity ratio of the white filter and the primary color filters will be explained.

For example, a light filter may include a transparent filter area (T or W), a red filter area (R), a green filter area (G), a blue filter area (B), or a color filter area which allows light of other colors to pass therethrough or blocks light of other colors. Since these color filter areas have different transmittance according to wavelengths of incident light, the sensitivity ratios of light (or exposure ratios) may be different.

Graphs 501 show the sensitivity ratios of the color filters. For example, according to graphs 501, the white filter area (T or W) may have high exposure ratios in comparison with the red filter area (R), the green filter area (G), and the blue filter area (B). In addition, the exposure ratios in the red filter area (R), the green filter area (G), and the blue filter area (B) may be similar to one another. In addition, light of a wider wavelength 503 may be transmitted through the white filter area (T or W) in comparison with the red filter area (R), the green filter area (G), and the blue filter area (B). In addition, light of wavelengths 505, 507, 509 having an almost similar range may be transmitted through the red filter area (R), the green filter area (G), and the blue filter area (B).

The amount of light exposed during the same exposure time may be higher in a photodiode located to correspond to the white filter area (T or W) than in a photodiode located to correspond to the primary color filter area. In addition, when light enters the pixel, the photodiode located to correspond to the white filter area (T or W) may receive light of more diverse wavelengths than the photodiode located to correspond to the primary color filter area. Accordingly, the photodiode located to correspond to the white filter area may react more sensitively to the brightness of light than the photodiode located to correspond to the primary color filter area. Therefore, when the YUV signal is generated using the T or W component included in the RGBW signal, the pre-processor 403 may generate an image of high sensitivity.

Referring to FIG. 4, the pre-processor 403 may receive the RGBW signal and convert the received RGBW signal into the YUV signal. For example, the pre-processor 403 may calculate a value of a brightness signal (Y) based on a value of at least one of the R, G and B signals and a value of a W signal, calculate a value of a color difference signal (U) based on the value of the B signal and the calculated value of the Y signal, and calculate a value of a color difference signal (V) based on the value of the R signal and the calculated value of the Y signal.

In another example, the pre-processor 403 may calculate the value of the brightness signal (Y) using only the value of the W signal. In another example, the pre-processor 403 may calculate a value of a first brightness signal (Y1) using only the value of the W signal, calculate a value of a second brightness signal (Y2) using the value of at least one of the R, G and B signals, and calculate the brightness signal (Y) by adding Y1 and Y2.

In another example, the pre-processor 403 may calculate the value of the brightness signal (Y) by changing a mixing ratio between the value of at least one of the R, G, and B signals and the value of the W signal according to illumination of an external environment. For example, when the illumination of the external environment is lower than pre-designated reference illumination, the pre-processor 403 may determine that the external environment has low illumination, and calculate the value of the brightness signal (Y) using only the value of the W signal or may calculate the value of the brightness value (Y) by increasing the mixing ratio of the value of the W signal in comparison to the value of at least one of the R, G, and B signals. Herein, the reference illumination may indicate illumination which is experimentally measured when the external environment has low illumination. In addition, the pre-processor 403 may calculate the value of the color difference signal (U) based on the value of the B signal and the calculated value of the Y signal, and calculate the value of the color difference signal (V) based on the value of the R signal and the calculated value of the Y signal.

In another example, when the external environment has illumination higher than or equal to the reference illumination, the pre-processor 403 may determine that the external environment is bright enough, and may calculate the value of the brightness signal (Y) using only the value of at least one of the R, G, and B signals or may calculate the value of the brightness signal (Y) by increasing the mixing ratio of the value of at least one of the R, G, and B signals in comparison to the value of the W signal.

According to an embodiment of the present disclosure, the pre-processor 403 may generate phase difference information of light based on a difference between a plurality of W components outputted from the plurality of diodes included in one pixel, and transmit the phase difference information to a processor (for example, the processor 110) for controlling the camera module or the ISP 405 so as to adjust the focus by moving the lens of the camera module (for example, the camera module 191) based on the phase difference information. According to an embodiment of the present disclosure, the pre-processor 403 may generate 3-dimension (3D) information of an image included in a frame by processing the phase difference information on a frame basis, and transmit the generated image 3D information to the image signal processor 405.

According to an embodiment of the present disclosure, the ISP 405 may receive the YUV signal on the frame basis, stores the received YUV signal in a memory (for example, the memory 130) or convert the YUV signal into an RGB signal, and display the RGB signal on a display (for example, the display 160). According to an embodiment of the present disclosure, the ISP 405 may receive the phase difference information and adjust the focus of the camera module by moving the lens of the camera module based on the received phase difference information. According to an embodiment of the present disclosure, the ISP 405 may receive the image 3D information, generate a 3D image of a corresponding frame based on the received 3D information, and output the image on the display or store the image in the memory.

FIGS. 6A and 6B, 7A and 7B, 8A and 8B, and 9 illustrate views showing a pixel structure of an image sensor according to various embodiments of the present disclosure. The pixel structure of the image sensor will be explained based on FIGS. 6A and 6B, 7A and 7B, 8A and 8B, and 9.

According to an embodiment of the present disclosure, the pixel structure may include a plurality of pixels. Each of the plurality of pixels may include a single micro lens, a light filter, and a plurality of photodiodes.

The light filter may be an optical element which controls characteristics of light by performing transmission, reflection, split, extraction, isolation, or separation with respect to light. The light filter may be an optical element which extracts (or isolates) a component of a specific wavelength from white light or light in which various wavelengths are mixed. According to an embodiment of the present disclosure, the light filter may include a color filter area. The color filter area may have a color for passing only light of a specific color in natural light (mixed light). The light filter may include a red (R) filter area, a green (G) filter area, or a blue (B) filter area. According to an embodiment of the present disclosure, the light filter may include a transparent filter area or a color filter area. The transparent filter area may be nearly colorless (transparent). In another example, the transparent filter area may have a color having transparency of 90% or higher. According to an embodiment of the present disclosure, the filter may include both the transparent filter (or white filter) area and the color filter area having at least one color of R, G, and B.

Figure 6A:
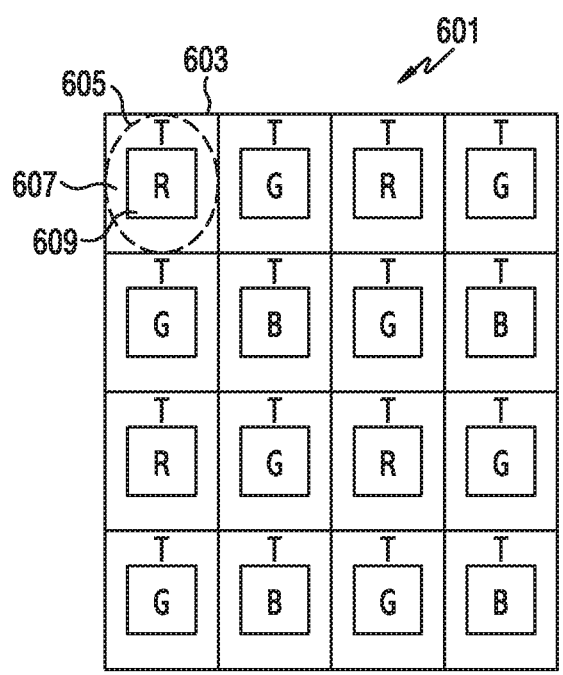
FIGS. 6A and 6B illustrate views showing a pixel structure of an image sensor according to an embodiment of the present disclosure.

According to an embodiment of the present disclosure, the pixel structure may include a single micro lens per pixel, and the structure of the light filter and the number of photodiodes may vary according to the pixel structure. According to an embodiment of the present disclosure, as shown in FIGS. 6A and 6B, a single pixel 603, 613 constituting a pixel structure 601, 611 may include a single micro lens 605, 615, a light filter including a single transparent filter area 607, 617 and a single color filter area 609, 619, and at least two diodes (not shown).

The transparent filter area and the color filter area in the single pixel do not overlap each other and may have various forms. According to an embodiment of the present disclosure, the transparent filter area may enclose an entirety or part of the color filter area. For example, as shown in FIG. 6A, the color filter area 609 may occupy an area of a predetermined size with reference to the center of the single pixel 603 and the transparent filter area 607 may occupy the other area, such that the transparent filter area 607 encloses the entirety of the color filter area 609.

Figure 6B:
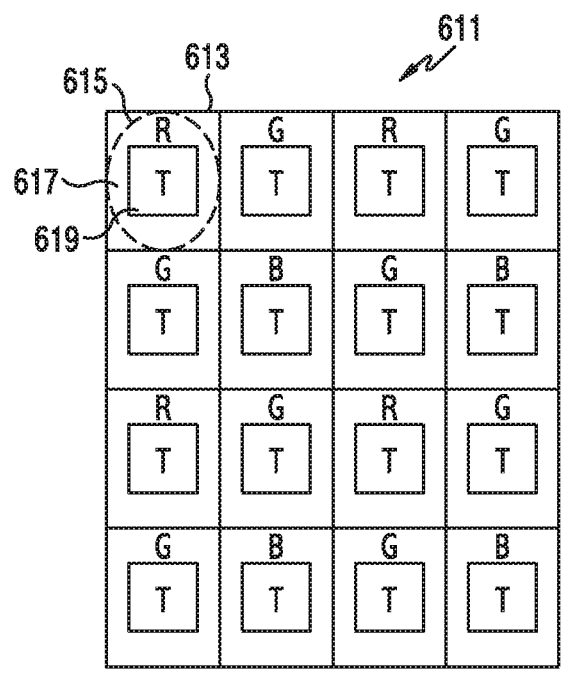

Referring to FIG. 6B, the color filter area 617 included in the pixel 613 may enclose at least part (or the entire area) of the transparent filter area 619.

Figure 7A:
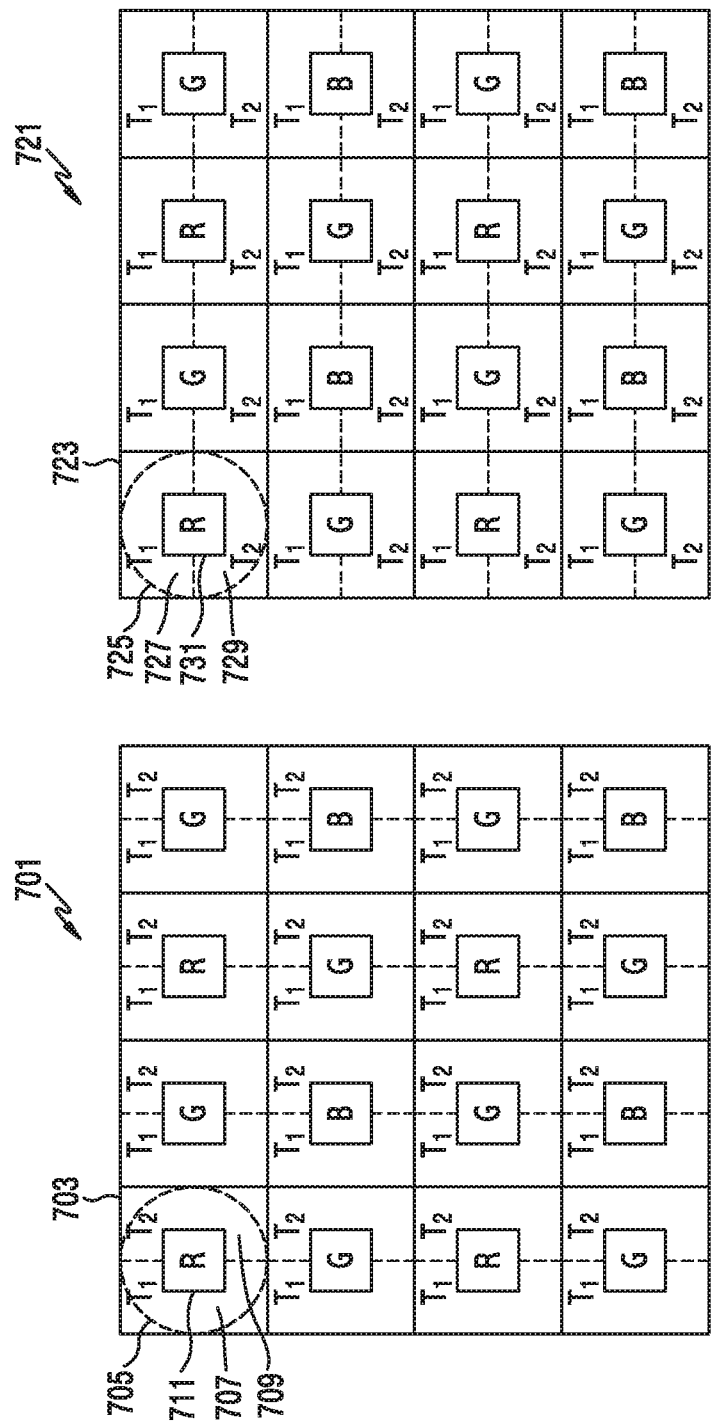
FIGS. 7A and 7B illustrate views showing a pixel structure of an image sensor according to an embodiment of the present disclosure.

According to an embodiment of the present disclosure, as shown in FIG. 7A, a single pixel 703, 723 constituting a pixel structure 701, 721 may include a single micro lens 705, 725, a light filter including two or more transparent filter areas 707, 709, 727, 729 and a color filter area 711, 731, and at least three diodes (not shown).

According to an embodiment of the present disclosure, as shown in FIG. 7A, the color filter area 711 may occupy an area of a predetermined size with reference to the center of the single pixel 703, and the two transparent filter areas 707, 709 may occupy the left/right areas with reference to the color filter area 711. For example, the pixel 703 may include the light filter including a first transparent filter area 707 and a second transparent filter area 709. The first transparent filter area 707 may be located on the left of the pixel 703 and the second transparent filter area 709 may be located on the right of the pixel 703. The first transparent filter area 707 and the second transparent filter area 709 may enclose at least part (or the entire area) of the color filter area 711 included in the pixel 703.

According to an embodiment of the present disclosure, the color filter area 731 may occupy an area of a predetermined size with reference to the center of the single pixel 723, and the two transparent filter areas 727, 729 may occupy the upper/lower areas with reference to the color filter area 731. For example, the pixel 723 may include the light filter including a first transparent filter area 727 and a second transparent filter area 729. The first transparent filter area 727 may be located on the upper end of the pixel 723 and the second transparent filter area 729 may be located on the lower end of the pixel 723. The first transparent filter area 727 and the second transparent filter area 729 may enclose at least part (or the entire area) of the color filter area 731 included in the pixel 723.

Figure 7B:
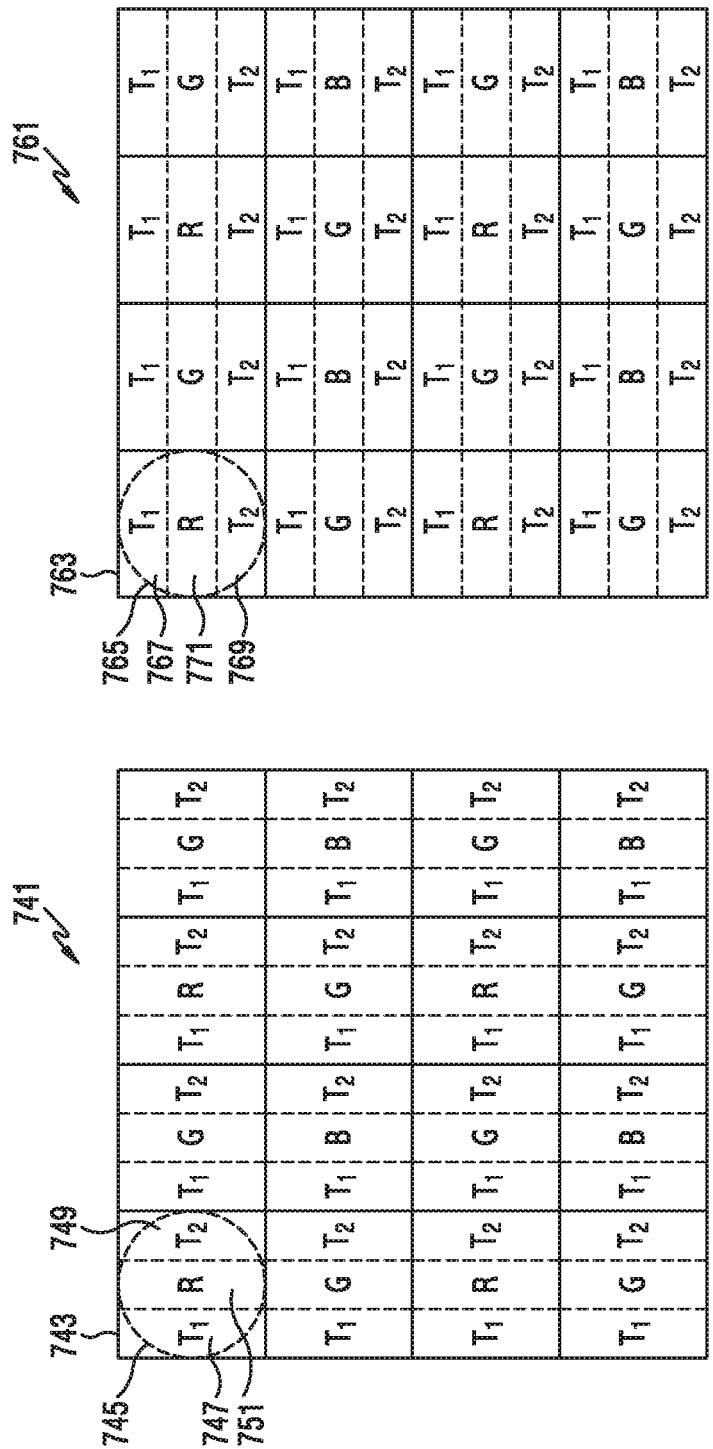

According to an embodiment of the present disclosure, as shown in FIG. 7B, a single pixel 743, 763 constituting a pixel structure 741, 761 may include a single micro lens 745, 765, a light filter including two or more transparent filter areas 747, 749, 765, 769 and one or more color filter areas 751, 771, and three diodes (not shown).

According to an embodiment of the present disclosure, the color filter area 751 may occupy the middle area from among the three areas which are formed by vertically dividing the single pixel 743 into three equal parts, and the transparent filter areas 747, 749 may occupy the other left/right areas, such that the two transparent filter areas 747, 749 enclose a part of the color filter area 751. For example, the pixel 743 may include the light filter including a first transparent filter area 747 and a second transparent filter area 749. The first transparent filter area 747 may be located on the left of the pixel 743 and the second transparent filter area 749 may be located on the right of the pixel 743. The color filter area 751 included in the pixel 743 may be located in the middle between the first and second transparent filter areas 747, 749.

According to an embodiment of the present disclosure, the color filter area 771 may occupy the middle area from among the three areas which are formed by horizontally dividing the single pixel 763 into three equal parts, and the transparent filter areas 767, 769 may occupy the other upper/lower areas. For example, the pixel 763 may include the light filter including a first transparent filter area 767 and a second transparent filter area 769. The first transparent filter area 767 may be located on the upper end of the pixel 763 and the second transparent filter area 769 may be located on the lower end of the pixel 763. The color filter area 771 included in the pixel 763 may be located in the middle between the first and second transparent filter areas 767, 769.

Figure 8A:
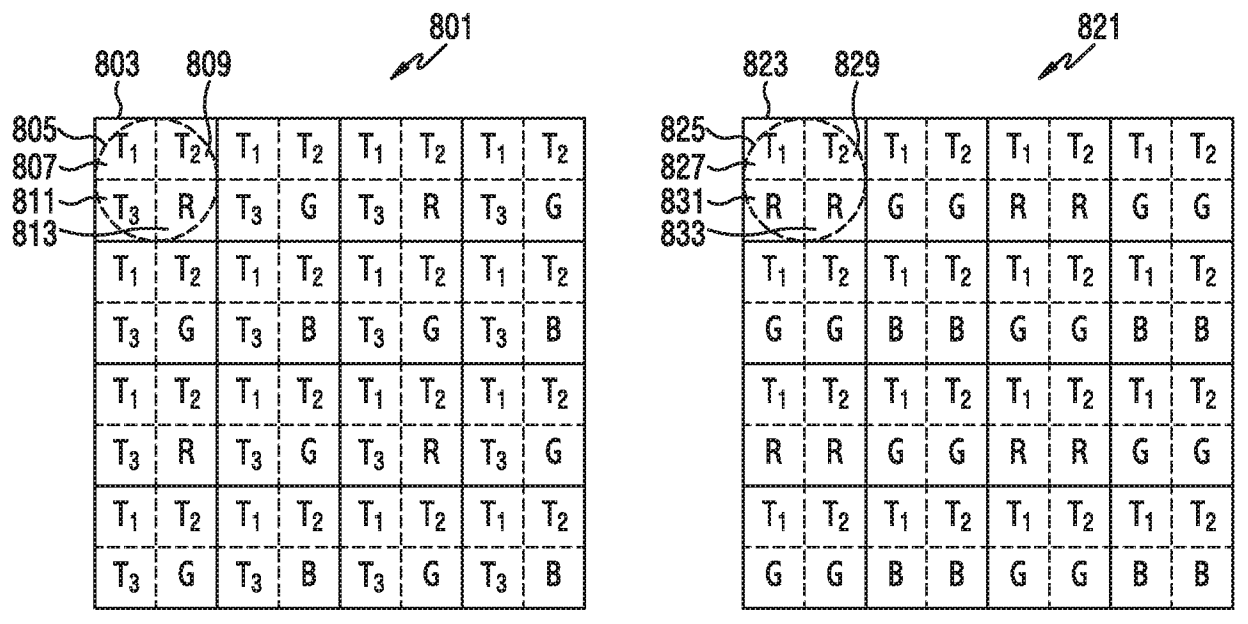

According to an embodiment of the present disclosure, referring to a pixel structure 801 of FIG. 8A, a single pixel 803 constituting the pixel structure 801 may include a single micro lens 805, a light filter including three or more transparent filter areas 807, 809, 811 and one or more color filter areas 813, and four or more diodes (not shown). According to an embodiment of the present disclosure, the color filter area 813 may occupy one of the four areas which are formed by dividing the single pixel 801 into four equal parts, and the transparent filter areas 807, 809, 811 may occupy the other areas. For example, the light filter included in the pixel 803 may include a first transparent filter area 807, a second transparent filter area 809, a third transparent filter area 811, and the color filter area 813. The first transparent filter area 807 may be located on the left upper end of the pixel 803.

The second transparent filter area 809 may be located on the right of the first transparent filter area 807 (for example, on the right upper end of the pixel 803). The third transparent filter area 811 may be located on the lower end of the first transparent filter area 807 (for example, the left lower end of the pixel 803). The color filter area 813 may be located on the right lower end of the pixel 803.

According to an embodiment of the present disclosure, referring to a pixel structure 821 of FIG. 8A, a single pixel 823 constituting the pixel structure 821 may include a single micro lens 825, a light filter including two or more transparent filter areas 827, 829 and two or more color filter areas 831, 833, and four or more diodes (not shown).

According to an embodiment of the present disclosure, the color filter areas 831, 833 may occupy two of the four areas which are formed by dividing the single pixel 823 into four equal parts, and the transparent filter areas 827, 829 may occupy the other two areas. For example, the light filter included in the pixel 823 may include a first transparent filter area 827, a second transparent filter area 829, a first color filter area 831, and a second color filter area 833. The first transparent filter area 827 may be located on the left upper end of the pixel 823. The second transparent filter area 829 may be located on the right of the first transparent filter area 827 (for example, on the right upper end of the pixel 823). The first color filter area 831 may be located on the left lower end of the pixel 823. The second color filter area 833 may be located on the right lower end of the pixel 823.

According to an embodiment of the present disclosure, the first color filter area 831 and the second color filter area 833 may be the same color filter areas. For example, both the first color filter area 831 and the second color filter area 833 may be red filter areas.

Figure 8B:
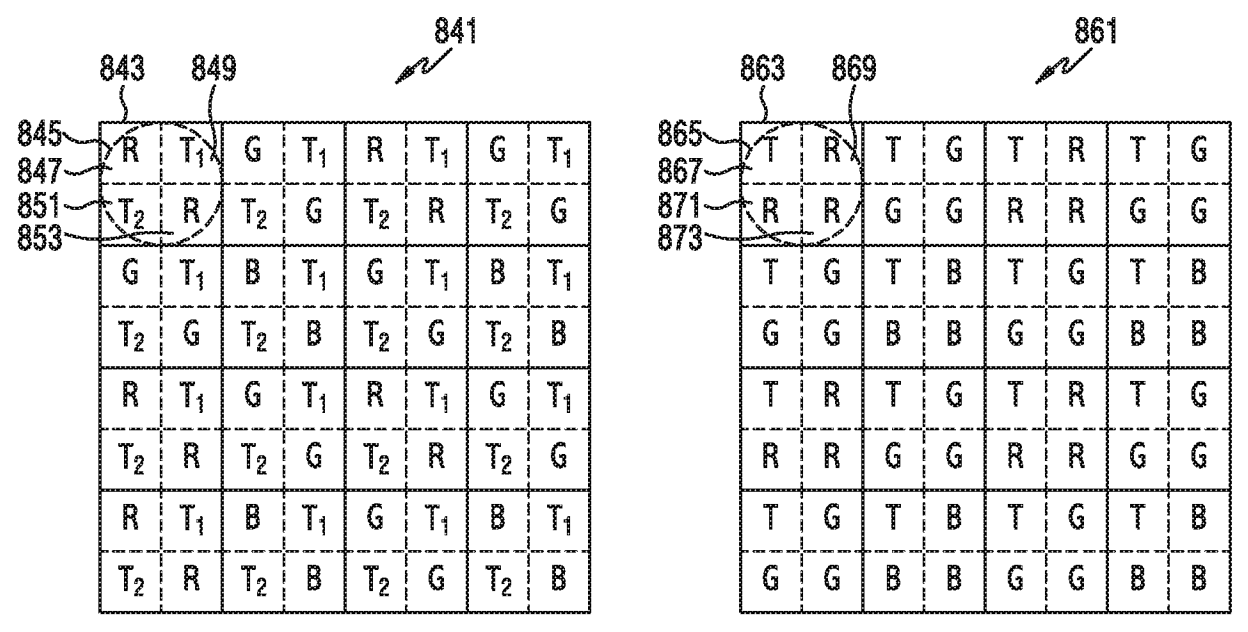

According to an embodiment of the present disclosure, referring to a pixel structure 841 of FIG. 8B, a single pixel 843 constituting the pixel structure 841 may include a single micro lens 845, a light filter including two or more transparent filter areas 849, 851 and two or more color filter areas 847, 853, and four or more diodes (not shown).

For example, the pixel 843 may include the light filter including a first color filter 847, a second color filter 853, a first transparent filter 849, and a second transparent filter 851. The first color filter 847 may be located on the left upper end of the pixel 843. The second color filter 853 may be located on the right lower end of the pixel 843. For example, the first color filter 847 may be located on the diagonal line from the second color filter 853. The first transparent filter 849 may be located on the right upper end of the pixel 843. The second transparent filter 851 may be located on the left lower end of the pixel 843. For example, the first transparent filter 849 may be located on the diagonal line from the second transparent filter 851.

According to an embodiment of the present disclosure, referring to a pixel structure 861 of FIG. 8B, a single pixel 863 constituting the pixel structure 861 may include a single micro lens 865, a light filter including one or more transparent filter areas 865 and three or more color filter areas 869, 871, 873, and four or more diodes (not shown). According to an embodiment of the present disclosure, the color filter areas may enclose the entirety or part of the transparent filter area. For example, the transparent filter area 867 may occupy one of the four areas which are formed by dividing the single pixel 863 into four equal parts, and the color filter areas 869, 871, 873 may occupy the other three areas, such that the color filter areas enclose a part of the transparent filter area.

For example, the pixel 863 may include the light filter including a first color filter area 869, a second color filter area 873, a third color filter area 871, and the transparent filter area 867. The first color filter area 869 may be located on the right upper end of the pixel 863. The second color filter area 873 may be located on the lower end of the first color filter area 869. The third color filter area 871 may be located on the left of the second color filter area 873. The transparent filter area 867 may be located on the left upper end of the pixel 863.

According to an embodiment of the present disclosure, the first, second, and third color filter areas 869, 873, 871 may be the same color filter areas. For example, all of the first, second, and third color filter areas 869, 873, 871 may be red filter areas.

Figure 9:
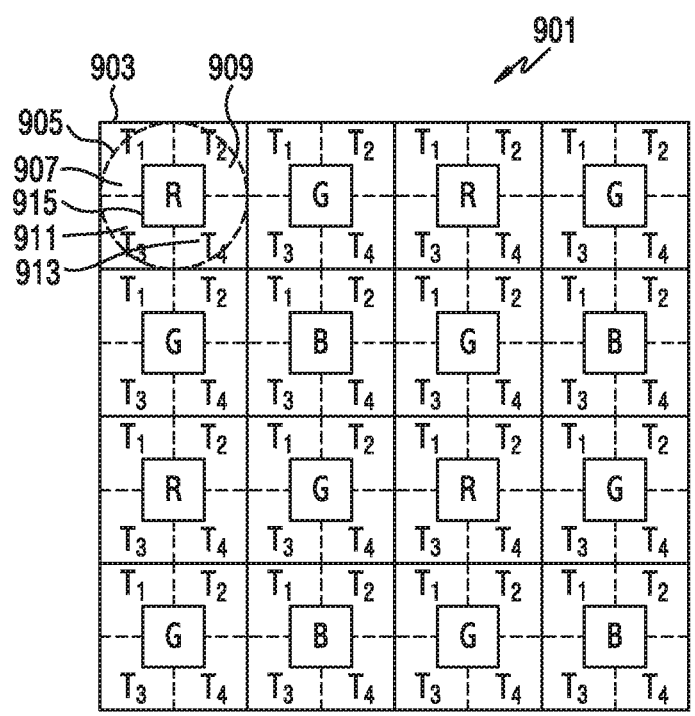
FIG. 9 illustrates a view showing a pixel structure of an image sensor according to an embodiment of the present disclosure.

According to an embodiment of the present disclosure, as shown in FIG. 9, a single pixel 903 constituting a pixel structure 901 may include a single micro lens 905, a light filter including four or more transparent filter areas 907, 909, 911, 913 and a color filter area 915, and five or more diodes (not shown). According to an embodiment of the present disclosure, the color filter area 915 may occupy an area of a predetermined size with reference to the center of the single pixel 903, and the four transparent filter areas 907, 909, 911, 913 may occupy the other areas. For example, the first to fourth transparent filter areas 907, 909, 911, 913 may enclose at least part (or the entire area) of the color filter area 915.

According to an embodiment of the present disclosure, the color filter area may be one of a green filter area, a red filter area, and a blue filter area. According to an embodiment of the present disclosure, the transparent filter areas may be white filter areas.

According to an embodiment of the present disclosure, the single color filter area and the single transparent filter area in the pixel may be the same or substantially the same in view of the size. Herein, being the same or substantially the same may refer to a case in which a difference in the size between the single color filter area and the single transparent filter area falls within a pre-designated range (about 90%).

When the single color filter area and the single transparent filter area are the same in view of the size as described above, a size ratio between the transparent filter area and the color filter area of the pixel structure may be 1:1 or 1:N, for example. For example, as shown in FIGS. 6A and 6B, the size ratio between the transparent filter area and the color filter area in each of the pixel structures 601, 611 may be 1:1. In another example, as shown in FIGS. 7A and 7B, the size ratio between the transparent filter area and the color filter area in each of the pixel structures 701, 721, 741, 761 may be 2:1.

In another example, as shown in FIGS. 8A and 8B, the size ratio between the transparent filter area and the color filter area in each of the pixel structures 801, 821, 841, 861 may be 3:1. In another example, as shown in FIG. 9, the size ratio between the transparent filter area and the color filter area in the pixel structure 901 may be 4:1.

For example, as shown in FIGS. 6A and 6B, the size ratio between the areas of respective filter colors in each of the pixel structures 601, 611 may be 4 (T or W):1 (R):2 (G):1 (B). In another example, as shown in FIGS. 7A and 7B, the size ratio between the areas of respective filter colors in each of the pixel structures 701, 721, 741, 761 may be 8 (T or W):1 (R):2 (G):1 (B). In another example, as shown in FIG. 8A, the size ratio between the areas of respective filter colors in the pixel structure 801 may be 12 (T or W):1 (R):2 (G):1 (B).

In another example, as shown in FIGS. 8A and 8B, the size ratio between the areas of respective filter colors in each of the pixel structures 821, 841 may be 4 (T or W):1 (R):2 (G):1 (B). In another example, as shown in FIG. 8B, the size ratio between the areas of respective filter colors in the pixel structure 861 may be 4 (T or W):3 (R):6 (G):3 (B). In another example, as shown in FIG. 9, the size ratio between the areas of respective filter colors in the pixel structure 901 may be 16 (T or W):1 (R):2 (G):1 (B).

According to a certain embodiment of the present disclosure, the color filter area and the transparent filter area may be different from each other in view of the size. For example, the size of the transparent filter area may be larger than the size of the color filter area. In another example, the size of the color filter area may be larger than the size of the transparent filter area. According to an embodiment of the present disclosure, the number of transparent filter areas may correspond to the number of color filter areas in the pixel structure.

FIGS. 10, 11, 12, 13, and 14 illustrate views showing a structure of each pixel of an image sensor according to various embodiments of the present disclosure. Hereinafter, the structure of each pixel of the image sensor will be explained with reference to FIGS. 10, 11, 12, 13, and 14.

The image sensor (for example, the image sensor 401) includes a plurality of pixels, and at least one pixel of the plurality of pixels may include photodiodes, a light filter which is stacked on the photodiodes and includes color filter and transparent filter areas, and a single micro lens.

According to an embodiment of the present disclosure, the image sensor may convert light which is received through the light filter including the color filter and transparent filter areas into a digital signal using the plurality of photodiodes on a pixel basis, and transmit the converted electric signal to a pre-processor (for example, the pre-processor 403). For example, when a single pixel area is divided into at least two areas, the image sensor may generate digital signals for the respective areas and transmit the generated digital signals.

Figure 10:
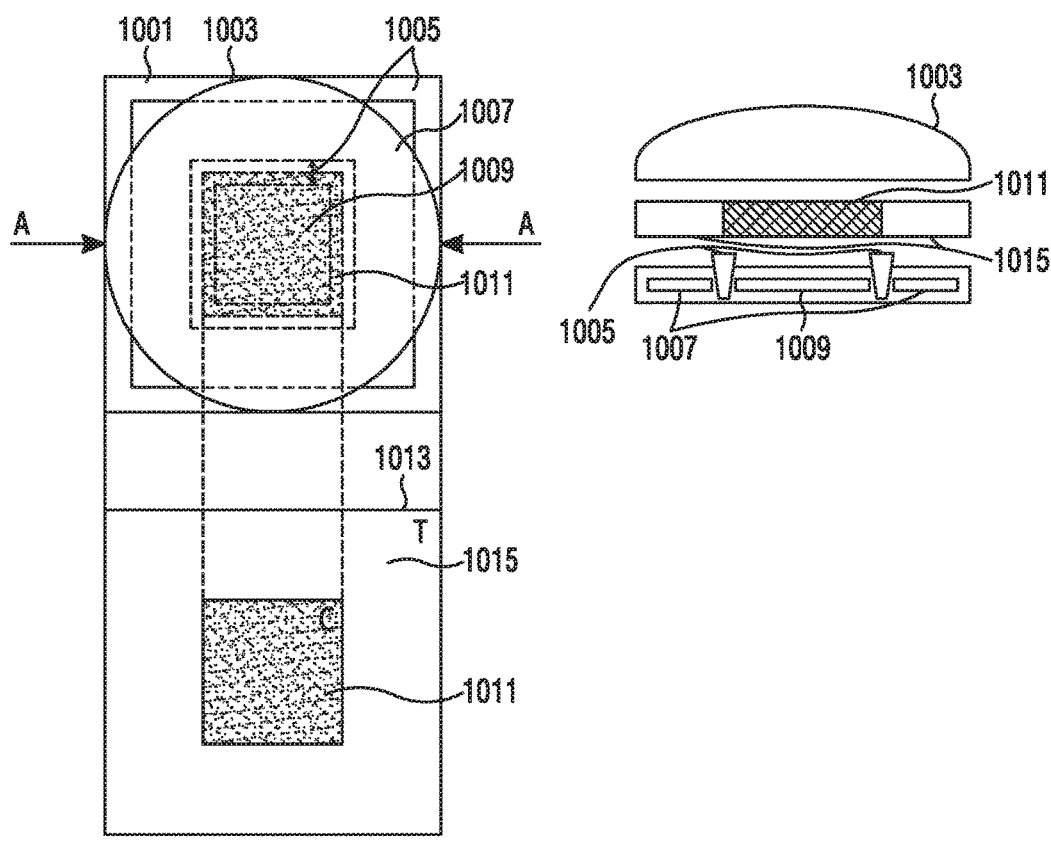
FIG. 10 illustrates a view showing a detailed pixel structure of an image sensor according to an embodiment of the present disclosure.

FIG. 10 illustrates a structure of a single pixel included in the pixel structure according to various embodiments of the present disclosure. The single pixel may include an image sensor circuit unit 1001 including a plurality of photodiodes, a light filter 1013 which is stacked on the image sensor circuit unit 1001 and includes a transparent filter area and a color filter area, and a micro lens 1003 which is stacked on the light filter 1013.

In explaining the elements in detail, according to an embodiment of the present disclosure, light entering the micro lens 1003 may be collected through the micro lens 1003 and transmitted to the light filter 1013. For example, the light filter 1013 may include the transparent filter area and the color filter area. For example, the color filter area may be one of a green filter area, a red filter area, and a blue filter area. For example, the transparent filter area may be a white filter area. Referring to FIG. 10, the color filter area (for example, one of the green filter area, the red filter area, and the blue filter area) 1011 may be located on the center of the light filter 1013, and the transparent filter area 1015 may be located on the other part. In another example, the transparent filter area may be located on the center of the light filter 1013 and the color filter area may be located on the other part.

According to an embodiment of the present disclosure, the light filter 1013 may be stacked on first and second photodiodes 1007, 1009 of the image sensor circuit unit 1001, and the color filter area and the transparent filter area may be stacked on the first and second photodiodes 1007, 1009, respectively. For example, as shown in FIG. 10, the transparent filter area 1015 may be stacked on the first photodiode 1007 and the color filter area 1011 may be stacked on the second photodiode 1009. In another example, the color filter area may be stacked on the first photodiode 1007 and the transparent (colorless) filter area may be stacked on the second photodiode 1009.

According to an embodiment of the present disclosure, the image sensor circuit unit 1001 may include the first and second photodiodes 1007, 1009. The first and second photodiodes 1007, 1009 may convert light (for example, a white signal or a color signal) entering through the light filter 1013 into an electric signal. For example, the first and second photodiodes 1007, 1009 may convert the energy of incident light into a voltage.

According to an embodiment of the present disclosure, the second photodiode 1009 having a predetermined size may be located on the center of the image sensor circuit unit 1001, and the first photodiode 1007 may be located on the other part. According to an embodiment of the present disclosure, a barrier 1005 may be located on the border of the pixel and between the first and second photodiodes 1007, 1009 to prevent at least part of the incident light from entering other pixels or other photodiode areas.

In addition, the sizes of the areas occupied by the first and second photodiodes 1007, 1009 may be substantially the same. Herein, being substantially the same may refer to a case in which a difference in the size between the areas of the first and second photodiodes 1007, 1009 falls within a pre-designated range (about 90%). In this case, the ratio between the areas of respective filter colors in the single pixel may be 1 (T or W area):1 (C area).

For example, reviewing the cross section view of the pixel with reference to the A direction by referring to FIG. 10, the pixel may include the image sensor circuit unit 1001 including the first and second photodiodes 1007, 1009, the light filter 1013 in which the color filter area 1011 and the transparent filter area 1015 covers the second photodiode 1009 and the first photodiode 1007, respectively, and the micro lens 1003 which is stacked on the light filter 1013.

Figure 11:
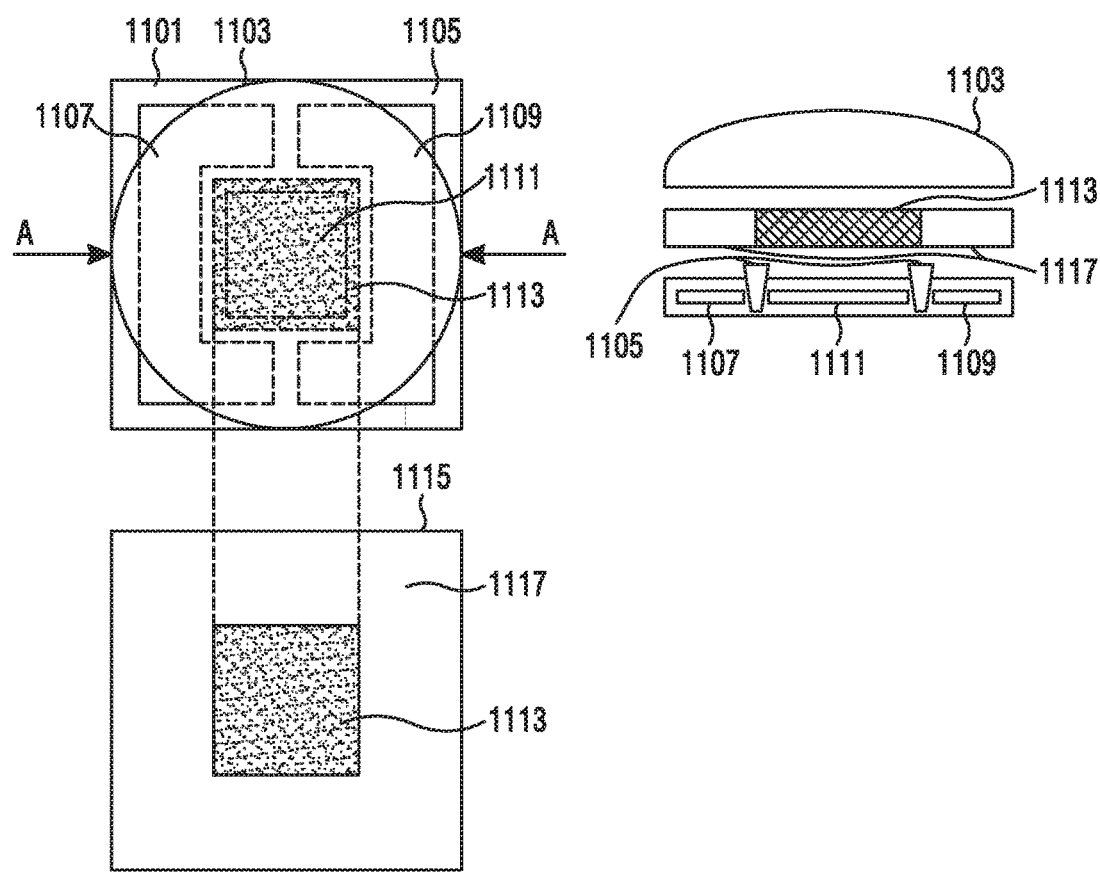
FIG. 11 illustrates a view showing a detailed pixel structure of an image sensor according to an embodiment of the present disclosure.

FIG. 11 illustrates a structure of a single pixel included in the pixel structure 701 according to various embodiments of the present disclosure. The pixel may include an image sensor circuit unit 1101 including a plurality of photodiodes, a light filter 1115 which is stacked on the image sensor circuit unit 1101 and includes a transparent filter area and a color filter area, and a micro lens 1103 which is stacked on the light filter 1115.

In explaining the elements in detail, according to an embodiment of the present disclosure, light entering the micro lens 1103 may be collected through the micro lens 1103 and transmitted to the light filter 1115. For example, the light filter 1115 may include the transparent filter area and the color filter area. For example, the color filter area may be one of a green filter area, a red filter area, and a blue filter area. For example, the transparent filter area may be a colorless or white filter area.

Referring to FIG. 11, the color filter area 1113 may be located on the center of the light filter 1115, and the transparent filter area 1117 may be located on the other part. In another example, the transparent filter area may be located on the center of the light filter 1115 and the color filter area may be located on the other part.

According to an embodiment of the present disclosure, the light filter 1115 may be stacked on first to third photodiodes 1107, 1109, 1111 of the image sensor circuit unit 1101, and the color filter area and the transparent filter area may be stacked on the first, second and third photodiodes 1107, 1109, 1111, respectively. For example, as shown in FIG. 11, the transparent filter area 1117 may be stacked on the first and second photodiodes 1107, 1109, and the color filter area 1113 may be stacked on the third photodiode 1111. In another example, the color filter area may be stacked on the first and second photodiodes 1107, 1109 and the transparent filter area may be stacked on the third photodiode 1111.

According to an embodiment of the present disclosure, the image sensor circuit unit 1101 may include the first to third photodiodes 1107, 1109, 1111. The first to third photodiodes 1107, 1109, 1111 may convert light entering through the light filter 1115 into an electric signal. For example, the first to third photodiodes 1107, 1109, 1111 may convert the energy of incident light into a voltage.

According to an embodiment of the present disclosure, the third photodiode 1111 having a predetermined size may be located on the center of the image sensor circuit unit 1101, and the first and second photodiodes 1107, 1109 may be located on the other part. For example, as shown in FIG. 11, the first and second photodiodes 1107, 1109 may be located on areas which are formed by vertically dividing the other part into two equal parts. In another example, the first and second photodiodes 1107, 1109 may be located on areas which are formed by horizontally dividing the other part into two equal parts. In addition, a barrier 1105 may be located on the border of the pixel or between the first to third photodiodes 1107, 1109, 1111 to prevent the incident light from entering other pixels or other photodiode areas.

In addition, the sizes of the areas occupied by the first to third photodiodes 1107, 1109, 1111 may be substantially the same. Herein, being substantially the same may refer to a case in which a difference in the size between the areas of the first to third photodiodes 1107, 1109, 1111 falls within a pre-designated range (about 90%). In this case, the ratio between the areas of respective filter colors in the single pixel may be 2 (T or W area):1 (C area).

For example, reviewing the cross section view of the pixel with reference to the A direction by referring to FIG. 11, the pixel may include the image sensor circuit unit 1101 including the first to third photodiodes 1107, 1109, 1111, the light filter 1115 in which the transparent filter area covers the areas of the first and second photodiodes 1107, 1109 and the color filter area covers the area of the third photodiode 1111, and the micro lens 1103 which is stacked on the light filter 1115.

Figure 12:
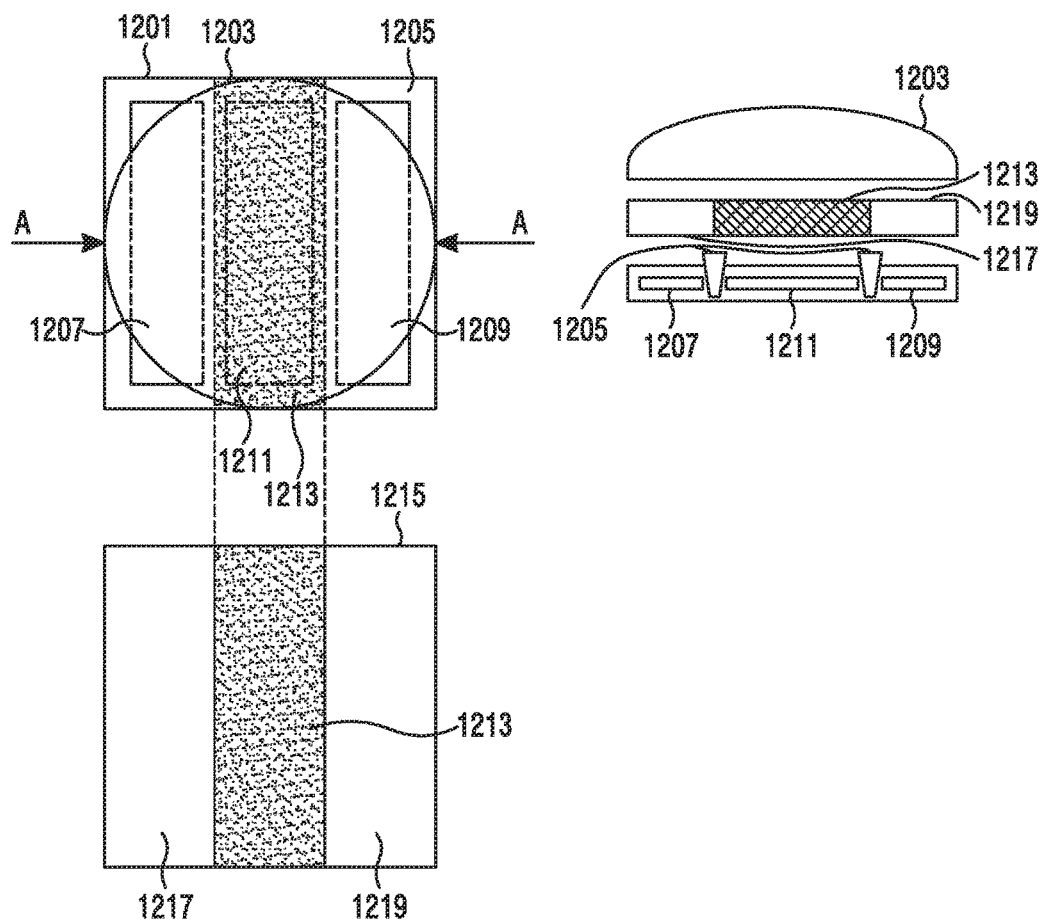
FIG. 12 illustrates a view showing a detailed pixel structure of an image sensor according to an embodiment of the present disclosure.

FIG. 12 illustrates a structure of a single pixel included in the pixel structure 741 according to various embodiments of the present disclosure. The pixel may include an image sensor circuit unit 1201 including at least a plurality of photodiodes, a light filter 1215 which is stacked on the image sensor circuit unit 1201 and includes a transparent filter area and a color filter area, and a micro lens 1203 which is stacked on the light filter 1215.

In explaining the elements in detail, according to an embodiment of the present disclosure, light entering the micro lens 1203 may be collected through the micro lens 1203 and transmitted to the light filter 1215. For example, the light filter 1215 may include the transparent filter area and the color filter area. For example, the color filter area may be one of a green filter area, a red filter area, and a blue filter area. For example, the transparent filter area may be a colorless or white filter area.

Referring to FIG. 12, the light filter 1215 may be vertically divided into three areas, and the color filter area 1213 may be located in the middle of the light filter 1215 and the transparent filter areas 1217, 1219 may be located on the other parts. In another example, the transparent filter area may be located in the middle of the light filter 1215 and the color filter areas may be located on the other parts. In another example, the light filter 1215 may be horizontally divided into three areas, and the color filter area may be located in the middle of the light filter 1215 and the transparent filter areas may be located on the other parts. In another example, the transparent filter area may be located in the middle of the light filter 1215 and the color filter areas may be located on the other parts.

According to an embodiment of the present disclosure, the light filter 1215 may be stacked on first to third photodiodes 1207, 1209, 1211 of the image sensor circuit unit 1201, and the color filter area and the transparent filter area may be stacked on the first to third photodiodes 1207, 1209, 1211, respectively. For example, as shown in FIG. 12, the transparent filter areas 1217, 1219 may be stacked on the first and second photodiodes 1207, 1209, and the color filter area 1213 may be stacked on the third photodiode 1211. Although not shown in the drawings, various embodiments of the present disclosure are not limited to this structure. In another example, the color filter area may be stacked on the first and second photodiodes 1207, 1209 and the transparent filter area may be stacked on the third photodiode 1211.

According to an embodiment of the present disclosure, the image sensor circuit unit 1201 may include the first to third photodiodes 1207, 1209, 1211. The first to third photodiodes 1207, 1209, 1211 may convert light entering through the light filter 1215 into an electric signal. For example, the first to third photodiodes 1207, 1209, 1211 may convert the energy of incident light into a voltage.

According to an embodiment of the present disclosure, the single pixel area may be vertically or horizontally divided into three areas, and the first to third photodiodes 1207, 1209, 1211 may be located on the three areas, respectively. For example, as shown in FIG. 12, when the one pixel area is vertically divided, the third photodiode 1211 may be located on the middle area and the first and second photodiodes 1207, 1209 may be located on the other parts. In another example, when the one pixel area is horizontally divided, the third photodiode 1211 may be located on the middle area and the first and second photodiodes 1207, 1209 may be located on the other parts. According to an embodiment of the present disclosure, a barrier 1205 may be located on the border of the pixel, between the first and third photodiodes 1207, 1211, or between the second and third photodiodes 1209, 1211 to prevent the incident light from entering other pixels or other photodiode areas.

For example, the sizes of the areas occupied by the first to third photodiodes 1207, 1209, 1211 may be substantially the same. Herein, being substantially the same may refer to a case in which a difference in the size between the areas of the first to third photodiodes 1207, 1209, 1211 falls within a pre-designated range (about 90%). In this case, the ratio between the areas of respective filter colors in the single pixel may be 2 (T or W area):1 (C area).

For example, reviewing the cross section view of the pixel with reference to the A direction by referring to FIG. 12, the pixel may include the image sensor circuit unit 1201 including the first to third photodiodes 1207, 1209, 1211, the light filter 1215 in which the transparent filter area covers the areas of the first and second photodiodes 1207, 1209 and the color filter area covers the area of the third photodiode 1211, and the micro lens 1203 which is stacked on the light filter 1215.

Figure 13:
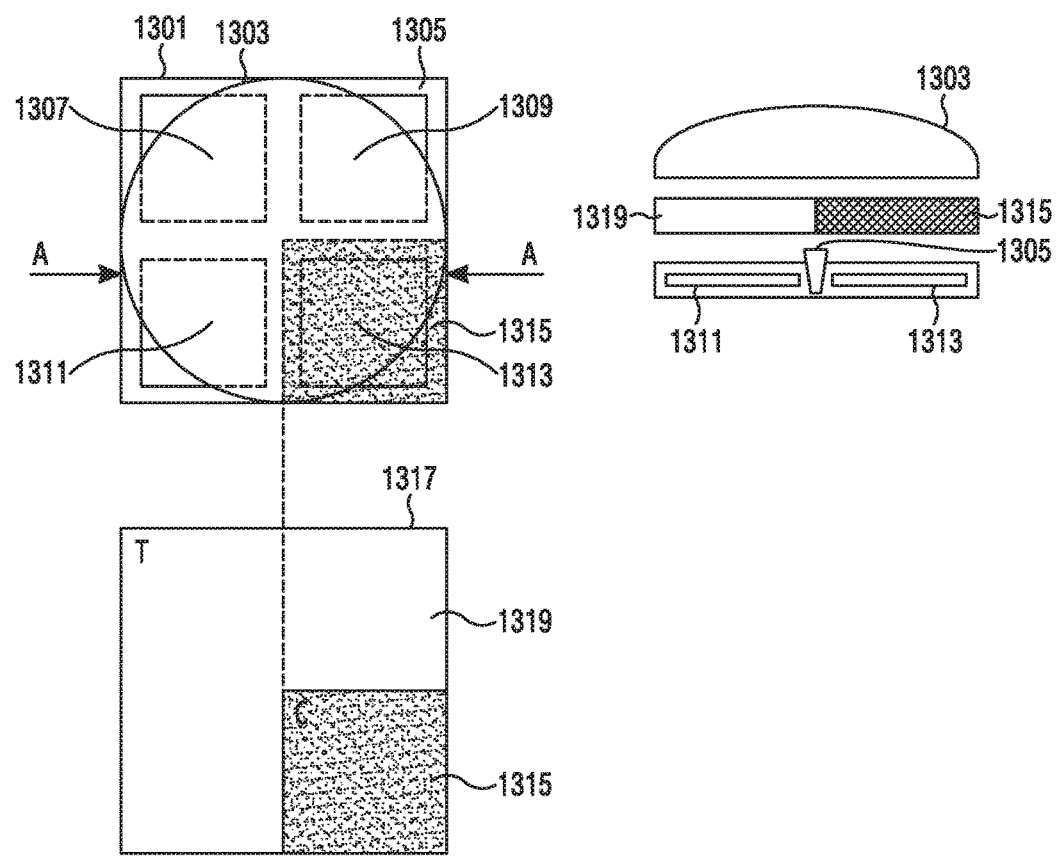
FIG. 13 illustrates a view showing a detailed pixel structure of an image sensor according to an embodiment of the present disclosure.

FIG. 13 illustrates a structure of a single pixel included in the pixel structure 801 according to various embodiments of the present disclosure. The pixel may include an image sensor circuit unit 1301 including at least a plurality of photodiodes, a light filter 1317 which is stacked on the image sensor circuit unit 1301 and includes a transparent filter area and a color filter area, and a micro lens 1303 which is stacked on the light filter 1317.

Referring to FIG. 13, in explaining the elements in detail, according to an embodiment of the present disclosure, light entering the micro lens 1303 may be collected through the micro lens 1303 and transmitted to the light filter 1317. For example, the light filter 1317 may include the transparent filter area and the color filter area. For example, the color filter area may be one of a green filter area, a red filter area, and a blue filter area. For example, the transparent filter area may be a colorless or white filter area. For example, as shown in FIG. 13, the light filter 1317 may be vertically divided into two parts and horizontally divided into two parts, thereby being divided into four areas, and the color filter area 1315 may be located on one of the four areas and the transparent filter area 1319 may be located on the other three areas. In another example, the color filter area may be located on two of the four areas and the transparent filter area may be located on the other two areas. In another example, the transparent filter area may be located on one of the four areas and the color filter area may be located on the other three areas.

According to an embodiment of the present disclosure, the light filter 1317 may be stacked on the plurality of photodiodes of the image sensor circuit unit 1301, and the color filter area and the transparent filter area may be stacked on the plurality of photodiodes. For example, as shown in FIG. 13, the transparent filter area 1319 may be stacked on the first, second and third photodiodes 1307, 1309, 1311, and the color filter area 1315 may be stacked on the fourth photodiode 1313.

According to an embodiment of the present disclosure, the image sensor circuit unit 1301 may include the first, second, third and fourth photodiodes 1307, 1309, 1311, 1313. The first to fourth photodiodes 1307, 1309, 1311, 1313 may convert light entering through the light filter 1317 into an electric signal. For example, the first to fourth photodiodes 1307, 1309, 1311, 1313 may convert the energy of incident light into a voltage.

According to an embodiment of the present disclosure, the single pixel area may be vertically divided into two parts and horizontally divided into two parts, thereby being divided into four areas, and the first to fourth photodiodes 1307, 1309, 1311, 1313 may be located on the four areas, respectively. For example, as shown in FIG. 13, the first to fourth photodiodes 1307, 1309, 1311, 1313 may be located on the left upper area, right upper area, left lower area, and right lower area, respectively.

For example, the sizes of the areas occupied by the first to fourth photodiodes 1307, 1309, 1311, 1313 may be substantially the same. Herein, being substantially the same may refer to a case in which a difference in the size between the areas of the first to fourth photodiodes 1307, 1309, 1311, 1313 falls within a pre-designated range (about 90%). In this case, the ratio between the areas of respective filter colors in the single pixel may be 3 (T or W area):1 (C area).

According to an embodiment of the present disclosure, a barrier 1305 may be located on the border of the pixel or between the first to fourth photodiodes 1307, 1309, 1311, 1313 to prevent the incident light from entering other pixels or other photodiode areas.

For example, reviewing the cross section view of the pixel with reference to the A direction by referring to FIG. 13, the pixel may include the image sensor circuit unit 1301 including the first to fourth photodiodes 1307, 1309, 1311, 1313, the light filter 1317 in which the transparent filter area covers the areas of the first to third photodiodes 1307, 1309, 1311 and the color filter area covers the area of the fourth photodiode 1313, and the micro lens 1303 which is stacked on the light filter 1317.

Figure 14:
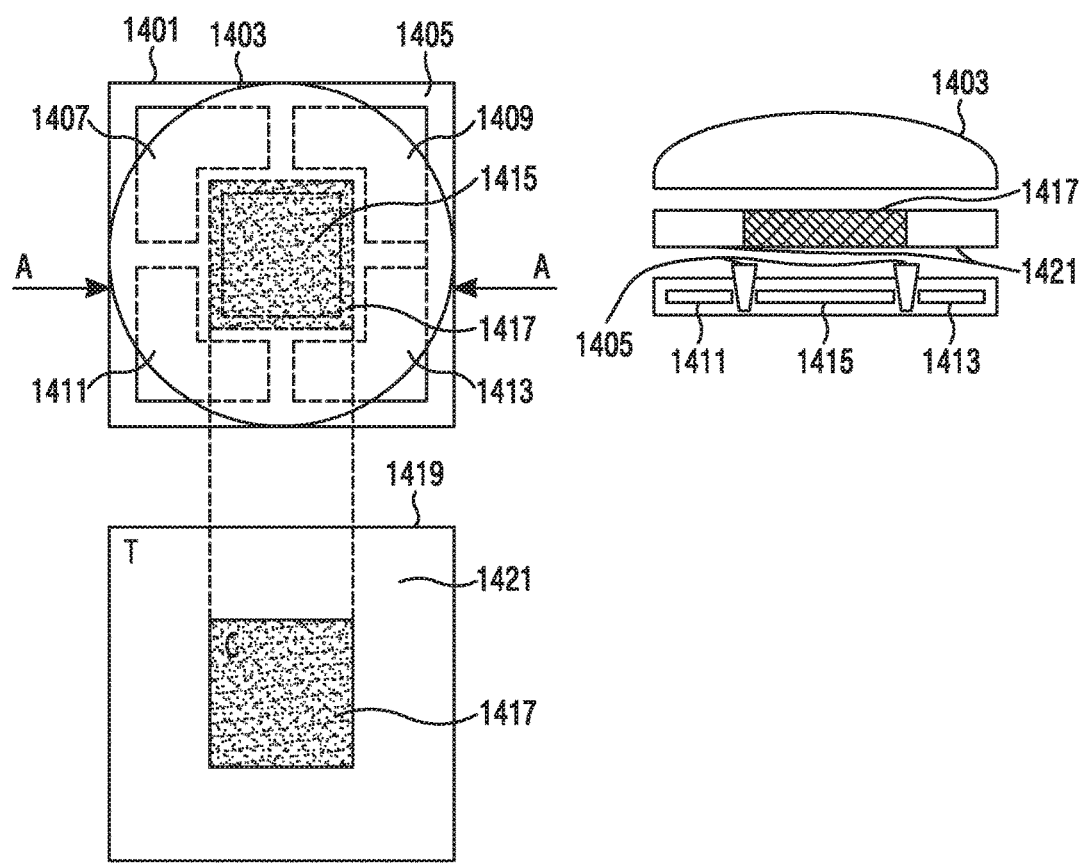
FIG. 14 illustrates a view showing a detailed pixel structure of an image sensor according to an embodiment of the present disclosure.

FIG. 14 illustrates a structure of a single pixel included in the pixel structure 901 according to various embodiments of the present disclosure. The pixel may include an image sensor circuit unit 1401 including at least a plurality of photodiodes, a light filter 1419 which is stacked on the image sensor circuit unit 1401 and includes a transparent filter area and a color filter area, and a micro lens 1403 which is stacked on the light filter 1419.

In explaining the elements in detail, according to an embodiment of the present disclosure, light entering the micro lens 1403 may be collected through the micro lens 1403 and transmitted to the light filter 1419. For example, the light filter 1419 may include the transparent filter area and the color filter area. For example, the color filter area may be one of a green filter area, a red filter area, and a blue filter area. For example, the transparent filter area may be a colorless or white filter area.

Referring to FIG. 14, the color filter area 1417 may be located on the center of the light filter 1419 and the transparent filter area 1421 may be located on the other area. In another example, the transparent filter area may be located on the center of the light filter 1419 and the color filter area may be located on the other area.

According to an embodiment of the present disclosure, the light filter 1419 may be stacked on the plurality of photodiodes of the image sensor circuit unit 1401, and the color filter area and the transparent filter area may be stacked on the plurality of photodiodes. For example, as shown in FIG. 14, the transparent filter area 1421 may be stacked on the first, second, third and fourth photodiodes 1407, 1409, 1411, 1413, and the color filter area 1417 may be stacked on the fifth photodiode 1415.

According to an embodiment of the present disclosure, the image sensor circuit unit 1401 may include the first, second, third, fourth and fifth photodiodes 1407, 1409, 1411, 1413, 1415. The first to fifth photodiodes 1407, 1409, 1411, 1413, 1415 may convert light entering through the light filter 1419 into an electric signal. For example, the first to fifth photodiodes 1407, 1409, 1411, 1413, 1415 may convert the energy of incident light into a voltage.

According to an embodiment of the present disclosure, the single pixel area may be divided into five areas. For example, as shown in FIG. 14, the five areas may include a center area having a predetermined size and areas which are formed by dividing the other area than the center area into four equal parts. In addition, the first to fifth photodiodes 1407, 1409, 1411, 1413, 1415 may be located on the five areas, respectively. For example, as shown in FIG. 14, the first to fifth photodiodes 1407, 1409, 1411, 1413, 1415 may be located on the left upper area, right upper area, left lower area, right lower area, and center area, respectively.

For example, the sizes of the areas occupied by the first to fifth photodiodes 1407, 1409, 1411, 1413, 1415 may be substantially the same. Herein, being substantially the same may refer to a case in which a difference in the size between the areas of the first to fifth photodiodes 1407, 1409, 1411, 1413, 1415 falls within a pre-designated range (about 90%).

In this case, the ratio between the areas of respective filter colors in the single pixel may be 4 (T or W area):1 (C area).

According to an embodiment of the present disclosure, a barrier 1405 may be located on the border of the pixel or between the first to fifth photodiodes 1407, 1409, 1411, 1413, 1415 to prevent the incident light from entering other pixels or other photodiode areas.

For example, reviewing the cross section view of the pixel with reference to the A direction by referring to FIG. 14, the pixel may include the image sensor circuit unit 1401 including the first to fifth photodiodes 1407, 1409, 1411, 1413, 1415, the light filter 1419 in which the transparent filter area covers the areas of the first to fourth photodiodes 1407, 1409, 1411, 1413 and the color filter area covers the area of the fifth photodiode 1415, and the micro lens 1403 which is stacked on the light filter 1419.

Various pixel structures of the image sensor have been described up to now with reference to FIGS. 10, 11, 12, 13, and 14. However, the pixel structure proposed in the present disclosure is not limited to these. For example, at least one pixel structure may be symmetrical with reference to a horizontal line, a vertical line, or a diagonal line. For example, the pixel 1001 may be symmetrical on the center point of the pixel with reference to the horizontal line, vertical line, or diagonal line. In another example, the pixel 1101 may be symmetrical on the center point of the pixel with reference to the horizontal line or vertical line.

In another example, at least one pixel structure may remove the transparent filter area of the light filter or may integrate the transparent filter area into the micro lens.

Figure 15:
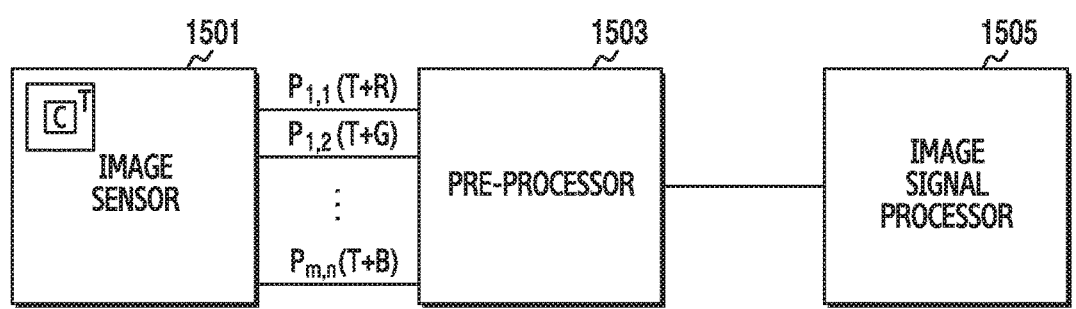
FIG. 15 illustrates a block diagram of a camera module according to an embodiment of the present disclosure.
Figure 16:
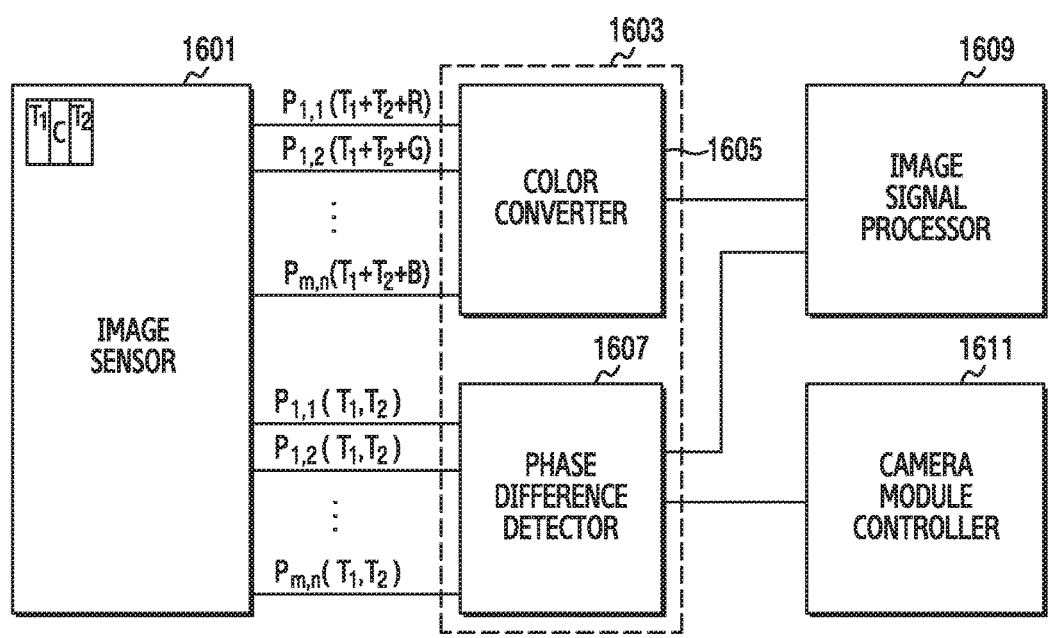
FIG. 16 illustrates a block diagram of a camera module according to an embodiment of the present disclosure.
Figure 17:
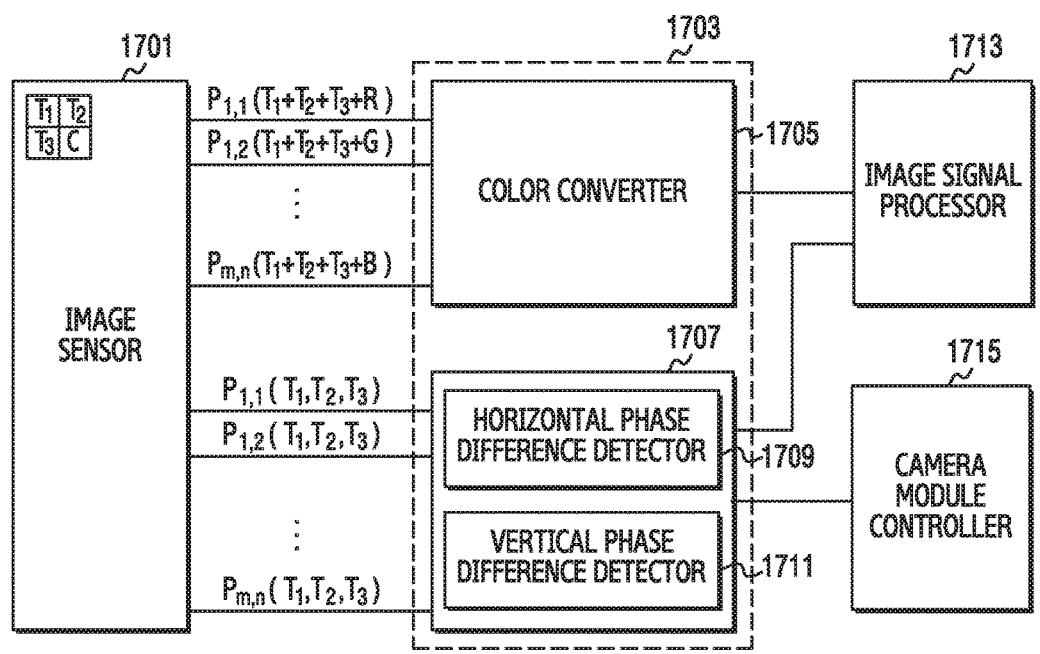
FIG. 17 illustrates a block diagram of a camera module according to an embodiment of the present disclosure.

FIGS. 15, 16, and 17 illustrate block diagrams showing a camera module according to various embodiments of the present disclosure. Hereinafter, the camera module of the present disclosure will be explained based on FIGS. 15, 16, and 17.

FIG. 15 illustrates a block diagram of a camera module when a transparent filter area is stacked on one of a plurality of diodes included in a pixel of an image sensor according to various embodiments.

Referring to FIG. 15, the camera module (for example, the camera module 191) may include an image sensor 1501, a pre-processor 1503, and an ISP 1505.

In explaining the elements in detail, according to an embodiment of the present disclosure, the image sensor 1501 may be a device which converts light entering a lens of the camera module into an electric signal.

For example, a light filter may include a transparent filter area and a color filter area. For example, the color filter area may include at least one of a green filter area, a red filter area, and a blue filter area. For example, the transparent filter area may include at least one of a colorless filter area and a white filter area. For example, when the light filter includes the green filter area, the red filter area, the blue filter area, and the transparent filter area, the light filter may be referred to as an RGBW color filter.

For example, the image sensor 1501 may transmit an RGBW signal corresponding to RGBW colors of the light filter to the pre-processor 1503. For example, the image sensor 1501 may transmit color information including brightness information for each pixel of each frame and primary color information to the pre-processor 1503. For example, the brightness information may be information on the light which is filtered through the transparent filter area of the light filter.

For example, as shown in FIG. 15, the image sensor 1501 may transmit the color information (for example, $P_{m,n}(T+B)$) including the brightness information for each pixel and the primary color information on one of red, green, and blue. Herein, for example, m indicates the number of pixel rows of the image sensor and n indicates the number of pixel columns of the image sensor.

According to an embodiment of the present disclosure, the data capacity of the color information may vary according to the number of photodiodes included in one pixel. For example, when two photodiodes are included in one pixel and the capacity of data outputted from one photodiode is 8 bits, the data capacity of the color information may be 16 bits.

According to an embodiment of the present disclosure, the pre-processor 1503 may receive the color information from the image sensor 1501, convert the color information into a YUV signal, and transmit the YUV signal to the ISP 1505. The ISP 1505 may receive the YUV signal on the frame basis, store the received YUV signal in a memory (for example, the memory 130) or convert the YUV signal into an RGB signal, and display the RGB signal on a display (for example, the display 160).

FIG. 16 illustrates a block diagram of a camera module when a transparent filter area is stacked on a plurality of diodes of at least a plurality of diodes included in a pixel of an image sensor according to various embodiments of the present invention.

Referring to FIG. 16, the camera module (for example, the camera module 191) may include an image sensor 1601, a pre-processor 1603, an ISP 1609, and a camera module controller 1611. For example, the camera module controller 1611 may be the processor 110.

In explaining the elements in detail, according to an embodiment of the present disclosure, the image sensor 1601 may be a device which converts light entering through a lens of the camera module into an electric signal. For example, the image sensor 1601 may transmit an RGBW signal corresponding to RGBW colors of a light filter to the pre-processor 1603. For example, the image sensor 1601 may transmit color information including brightness information for each pixel of each frame and primary color information to a color converter 1605 of the pre-processor 1603. For example, when three photodiodes are included in one pixel and a transparent filter area is stacked on two of the three photodiodes and a color filter area is stacked on the other diode, the image sensor 1601 may transmit the color information (for example, $P_{m,n}(T_1+T_2+C(R \text{ or } G \text{ or } B))$) including the brightness information corresponding to the plurality of photodiodes of each pixel, and the primary color information corresponding to one photodiode and related to one of red, green, and blue, as shown in FIG. 16.

According to an embodiment of the present disclosure, the data capacity of the color information may vary according to the number of photodiodes included in one pixel. For example, when the pixel includes three photodiodes and the capacity of data outputted from one diode is 8 bits, the data capacity of the color information including the brightness information corresponding to two diodes and the primary color information corresponding to one diode may be 24 bits.

According to an embodiment of the present disclosure, the image sensor 1601 may transmit the brightness information of each pixel of each frame to a phase difference detector 1607 of the pre-processor 1603. For example, when the pixel includes three photodiodes and the transparent filter area is stacked on two of the three photodiodes, the image sensor 1601 may transmit the brightness information (for example, $P_{m,n}(T_1, T_2)$) corresponding to the plurality of photodiodes of each pixel as shown in FIG. 16.

According to an embodiment of the present disclosure, the pre-processor 1603 may include the color converter 1605 and the phase difference detector 1607. For example, the color converter 1605 may receive the color information (for example, $P_{m,n}(T_1+T_2+C(R$ or $G$ or $B)))$ from the image sensor 1601, convert the received color information into a YUV signal, and transmit the YUV signal to the ISP 1609.

According to an embodiment of the present disclosure, the phase difference detector 1607 may receive the brightness information (for example, $P_{m,n}(T_1, T_2)$) from the image sensor 1601, detect a phase difference of light based on the brightness information, and transmit the detected phase difference to the camera module controller 1611.

When at least a plurality of W components are included in the RGBW signal which is received on the pixel basis, the phase difference detector 1607 may generate phase difference information of light based on a difference between the plurality of W components, and transmit the phase difference information to the processor 110 for controlling the camera module 191 or the camera module controller 1611, such that the lens of the camera module 191 is moved based on the phase difference information to adjust a focus. For example, the phase difference detector 1607 may generate 3D information of an image included in the frame by processing the phase difference information on the frame basis, and transmit the generated image 3D information to the ISP 1609.

According to an embodiment of the present disclosure, the ISP 1609 may receive the YUV signal on the frame basis, store the received YUV signal in the memory 130 or convert the YUV signal into an RGB signal, and display the RGB signal on a display (for example, the display 160). For example, the ISP 1609 may receive the image 3D information from the phase difference detector 1607, generate a 3D image of a corresponding frame based on the received 3D information, and output the 3D image on the display or store the 3D image in the memory (for example, the memory 130).

According to an embodiment of the present disclosure, the camera module controller 1611 may receive the phase difference information from the phase difference detector 1607, and may adjust the focus of the camera module by moving the lens of the camera module based on the received phase difference information.

FIG. 17 illustrates a block diagram of a camera module when a transparent filter area is stacked on at least three of at least a plurality of photodiodes included in a pixel of an image sensor according to various embodiments of the present invention.

Referring to FIG. 17, the camera module (for example, the camera module 191) may include an image sensor 1701, a pre-processor 1703, an ISP 1713, and a camera module controller 1715. For example, the camera module controller 1715 may be the processor 110.

In explaining the elements in detail, according to an embodiment of the present disclosure, the image sensor 1701 may convert light entering through a lens of the camera module 191 into an electric signal. For example, the image sensor 1701 may transmit an RGBW signal corresponding to RGBW colors of a light filter to the pre-processor 1703. For example, the image sensor 1701 may transmit color information including brightness information for each pixel of each frame and primary color information to a color converter 1705 of the pre-processor 1703. For example, when the pixel may include four photodiodes and a transparent filter area is stacked on three of the four photodiodes and a primary color filter is stacked on the other photodiode, the image sensor 1701 may transmit the color information (for example, $P_{m,n}(T_1+T_2+T_3+C(R$ or $G$ or $B)))$ including the brightness information corresponding to the three photodiodes of each pixel, and the primary color information corresponding to one photodiode and related to one of red, green, and blue, as shown in FIG. 17.

According to an embodiment of the present disclosure, the data capacity of the color information may vary according to the number of photodiodes included in one pixel. For example, when the pixel includes four photodiodes and the capacity of data outputted from one diode is 8 bits, the data capacity of the color information including the brightness information corresponding to three diodes, and the primary color information corresponding to one diode may be 32 bits.

According to an embodiment of the present disclosure, the image sensor 1701 may transmit the brightness information of each pixel of each frame to a phase difference detector 1707 of the pre-processor 1703. For example, when the pixel includes four photodiodes and the transparent filter area is stacked on three of the four photodiodes, the image sensor 1701 may transmit the brightness information (for example, $P_{m,n}(T_1, T_2, T_3)$) corresponding to the plurality of photodiodes of each pixel as shown in FIG. 17.

According to an embodiment of the present disclosure, the pre-processor 1703 may include the color converter 1705 and the phase difference detector 1707. For example, the color converter 1705 may receive the color information (for example, $P_{m,n}(T_1+T_2+T_3+C(R$ or $G$ or $B)))$ from the image sensor 1701, convert the received color information into a YUV signal, and transmit the YUV signal to the ISP 1713.

According to an embodiment of the present disclosure, the phase difference detector 1707 may include a horizontal phase difference detector 1709 and a vertical phase difference detector 1711. For example, the phase difference detector 1707 may receive the brightness information (for example, $P_{m,n}(T_1, T_2, T_3)$) from the image sensor 1701, detect horizontal and vertical phase differences of light based on the brightness information, and transmit the detected horizontal and vertical phase differences to the camera module controller 1715.

For example, the horizontal phase difference detector 1709 may generate horizontal phase difference information of light using brightness information (for example, $T_1, T_2$) on a pair of photodiodes (for example, 1307, 1309 of FIG. 13) located on the horizontal line in the pixel from among the received brightness information. For example, the vertical phase difference detector 1711 may generate vertical phase difference information of light using brightness information (for example, $T_1, T_3$) on a pair of photodiodes (for example, 1307, 1311 of FIG. 13) located on the vertical line in the pixel from among the received brightness information.

According to an embodiment of the present disclosure, the horizontal phase difference detector 1709 may compare brightness information (for example, $T_1$ and $T_2$) detected from the photodiodes (for example, photodiodes 1307, 1309 of FIG. 13) located on the horizontal line, and generate horizontal phase difference information based on the result of the comparing. According to an embodiment of the present disclosure, the vertical phase difference detector 1711 may compare brightness information (for example, $T_1$ and $T_3$) detected from the photodiodes (for example, photodiodes 1307, 1311 of FIG. 13) located on the vertical line, and generate vertical phase difference information based on the result of the comparing. According to an embodiment of the present disclosure, the phase difference detector 1707 may generate 3D information of an image included in the frame by processing the horizontal and vertical phase difference information on the frame basis, and transmit the generated image 3D information to the ISP 1713.

According to an embodiment of the present disclosure, the ISP 1713 may generate a 3D image based on the image 3D information, and display the 3D image or store it in a memory (for example, the memory 160). The ISP 1713 performs almost similar operations to those of the ISP 1609 of FIG. 16, and thus a detailed description thereof is omitted. According to an embodiment of the present disclosure, the camera module controller 1715 may receive the horizontal and vertical phase difference information, and adjust the focus of the camera module by moving the lens of the camera module based on the received horizontal and vertical phase difference information.

Figure 18A:
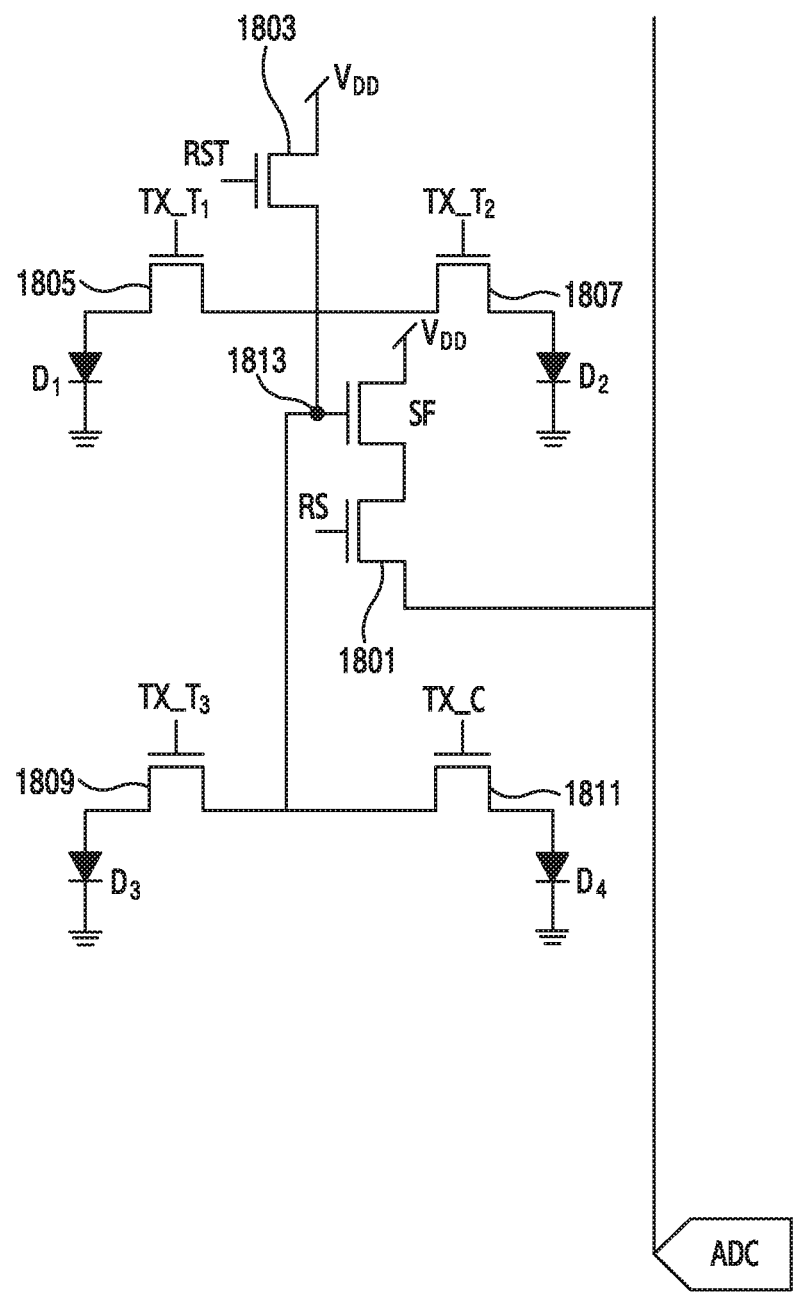
FIGS. 18A and 18B illustrate pixel circuit diagrams of an image sensor according to an embodiment of the present disclosure.
Figure 18B:
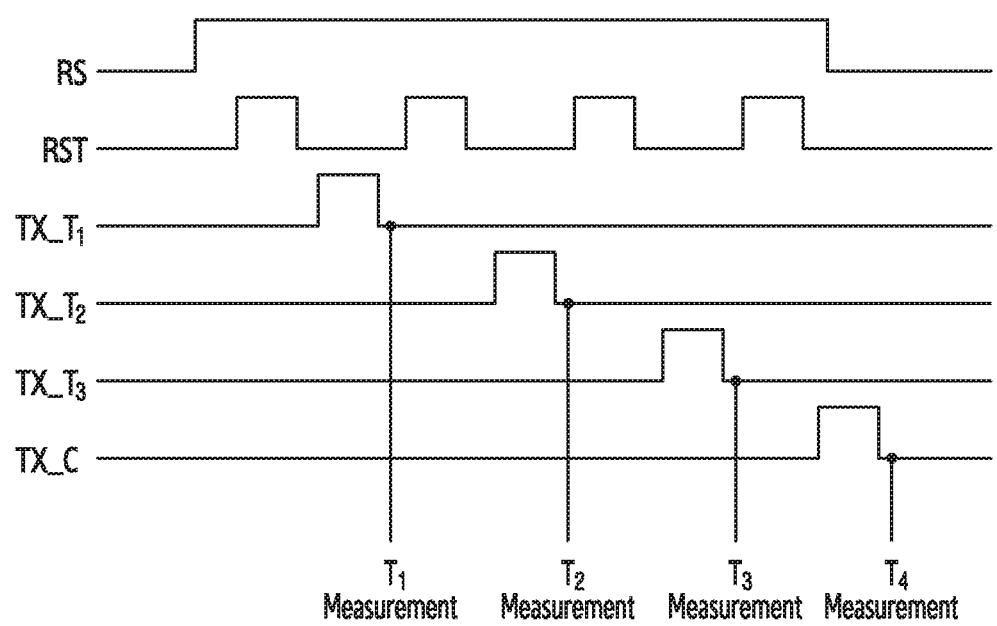

FIGS. 18A and 18B illustrate circuit diagrams of an image sensor according to an embodiment of the present disclosure. Hereinafter, the operations of the image sensor circuit will be explained based on FIGS. 18A and 18B.

According to an embodiment of the present disclosure, FIG. 18A illustrates an image sensor circuit diagram when one pixel includes four photodiodes. For example, the image sensor circuit diagram may be the circuit diagram of the image sensor 1701 of FIG. 17.

Referring to FIG. 18A, the four photodiodes D1, D2, D3, D4 may be electrically connected with transmission switches TX_T$_1$, TX_T$_2$, TX_T$_3$, TX_C 1805, 1807, 1809, 1811, respectively, to transmit their respective signals.

According to an embodiment of the present disclosure, the photodiodes D1, D2, D3, D4 may receive light passing through the same micro lens. For example, three of the four photodiodes D1, D2, D3 may receive light passing through a transparent filter area, and generate an electric charge corresponding to the received light energy. The other photodiode D4 may receive light passing through a color filter area and generate an electric charge corresponding to the received light energy.

According to an embodiment of the present disclosure, the electric charges generated in the photodiodes D1, D2, D3, D4 may be transmitted to a floating diffusion area 1813 through the transmission switches 1805, 1807, 1809, 1811. According to an embodiment of the present disclosure, a selection switch (RS) 1801 may select a corresponding pixel from among at least a plurality of pixels included in the image sensor. According to an embodiment of the present disclosure, a reset switch (RST) 1803 may reset the floating diffusion area 1813. According to an embodiment of the present disclosure, when the RST 1803 resets the floating diffusion area 1813 and then one of the transmission switches 1805, 1807, 1809, 1811 transmits the electric charge to the floating diffusion area 1813, an amplification switch (SF) 1815 may output the electric potential of the floating diffusion area 1813 as an output voltage of the corresponding transmission switch 1805, 1807, 1809, 1811.

For example, when the transparent filter area of the light filter is stacked on the photodiodes D1 to D3 and the color filter area of the light filter is stacked on the photodiode D4, the output voltages of the photodiodes D1 to D4 may be components of the color information outputted from the image sensor 1701 of FIG. 17. For example, the output voltage of the photodiode D1 may be T$_1$ signal of FIG. 17, the output voltage of the photodiode D2 may be T$_2$ signal of FIG. 17, the output voltage of the photodiode D3 may be T$_3$ signal of FIG. 17, and the output voltage of the photodiode D4 may be one of R, G B signals of FIG. 17.

Referring to FIG. 18B, time charts of the switches 1801, 1803, 1805, 1809, 1811 will be explained. According to an embodiment of the present disclosure, when a corresponding pixel is selected, the selection switch 1801 may be in a high level (hereinafter, referred to as an "active state") during a pre-designated time. According to an embodiment of the present disclosure, when the selection switch 1801 enters the active state, the RST 1804 may reset the floating diffusion area 1813 by generating a pulse (hereinafter, referred to as a "reset pulse") having a high level periodically during a pre-designated time.

According to an embodiment of the present disclosure, when the selection switch 1801 generates the reset pulse, the transmission switches 1805, 1807, 1809, and 1811 may transmit the electric charges generated in the photodiodes D1, D2, D3, and D4 to the floating diffusion area 1813 in sequence by generating a pulse (hereinafter, referred to as a "transmission pulse") having a high level during a pre-designated time in sequence according to a pre-designated order. In addition, when one of the transmission switches 1805, 1807, 1809, 1811) transmits the electric charge to the floating diffusion area 1813, the SF 1815 may output the electric potential of the floating diffusion area 1813 as an output voltage of the corresponding transmission switch.

Figure 19:
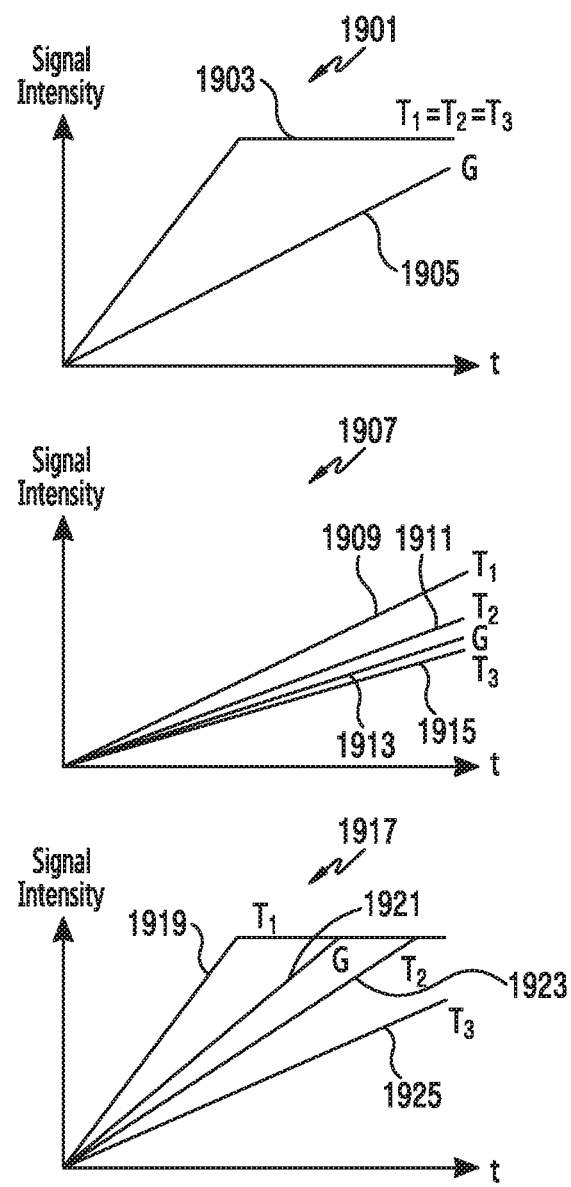
FIG. 19 illustrates a graph showing signal intensities of a plurality of photodiodes included in a pixel according to an embodiment of the present disclosure.

FIG. 19 illustrates graphs showing signal intensities of a plurality of photodiodes included in a pixel according to an embodiment of the present disclosure. Hereinafter, a phase difference will be explained using the signal intensities of the plurality of photodiodes D1, D2, D3, D4 with referent of FIG. 19.

Referring to FIG. 19 illustrates a view showing first, second and third graphs 1901, 1907, 1917 showing signal intensities, for example, voltages of T$_1$, T$_2$, T$_3$, and C.

In the first graph 1901, the signals intensities 1903 of T$_1$, T$_2$ and T$_3$ are the same or similar, and the signal intensity 1905 of C is different from the signal intensities 1903 of T$_1$, T$_2$ and T$_3$. The same signal intensities 1903 of T$_1$, T$_2$ and T$_3$ indicate that the horizontal and vertical phase difference of light is small (for example, there is no horizontal and vertical phase difference), and that the camera module 191 is in focus. In this case, a camera module controller (for example, the camera module controller 1715) may not move the lens of the camera module.

In the second graph 1907, the signal intensities 1909, 1911, 1913, 1915 of T$_1$, T$_2$, T$_3$ and C are different from one another. The different signal intensities 1909, 1911, 1915 of T$_1$, T$_2$ and T$_3$ may mean that there is a horizontal or vertical phase difference of light, and that the camera module 191 is out of focus. In this case, the camera module controller (for example, the camera module controller 1715) may adjust the focus of the camera module by moving the lens of the camera module based on the horizontal and vertical phase difference.

In the third graph 1917, the signal intensities 1919, 1921, 1923, 1925 of T$_1$, T$_2$, T$_3$ and C are different from one another as in the second graph 1907. However, for example, the signal intensities 1919, 1923, 1925 of T$_1$, T$_2$, T$_3$ may be higher than the signal intensities 1909, 1911, 1915 of T$_1$, T$_2$, T$_3$ of the second graph 1907. The different signal intensities 1919, 1923, 1925 of T$_1$, T$_2$, T$_3$ as in the third graph 1917 may mean that there is a horizontal or vertical phase difference of light, and that the camera module 191 is out of focus. In this case, the camera module controller (for example, the camera module controller 1715) may adjust the focus of the camera module by moving the lens of the camera module based on the horizontal and vertical phase difference.

Figure 20:
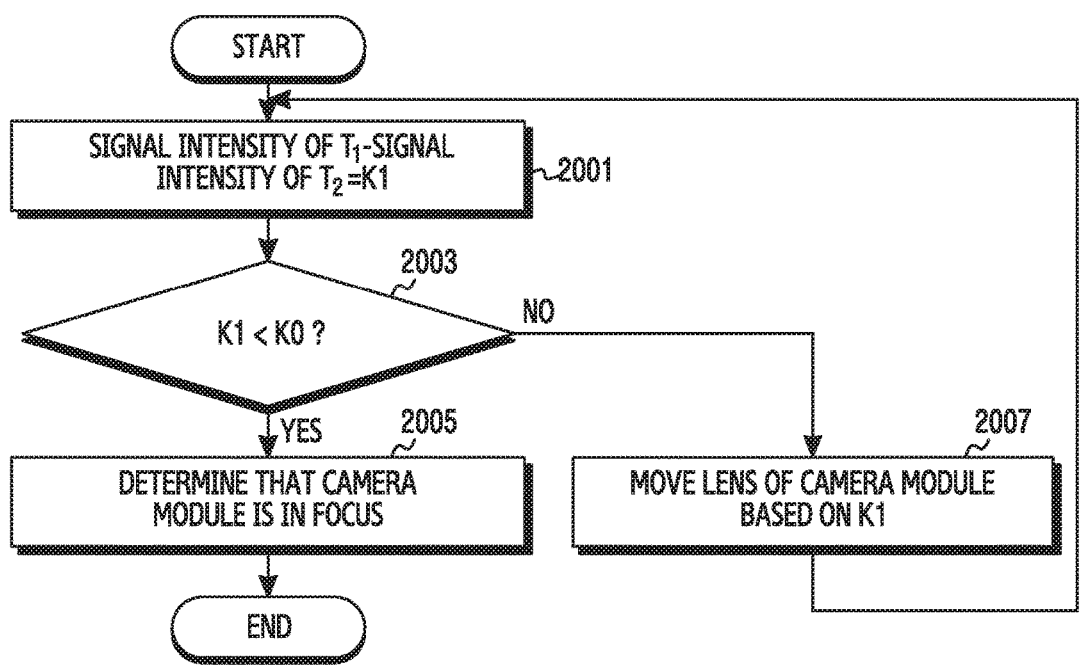
FIG. 20 illustrates a flowchart for adjusting a focus of a camera module in an electronic device according to an embodiment of the present disclosure.

FIG. 20 illustrates a flowchart for performing an auto focusing function to automatically adjust the focus of the camera module in the electronic device according to a first embodiment of the present disclosure. For the sake of easy explanation of the present disclosure, it is assumed in the first embodiment that the pixel includes at least three photodiodes, at least two of the three photodiodes are arranged in the horizontal or vertical direction, and a transparent filter area is stacked on at least two photodiodes.

Referring to FIG. 20, in operation 2001, the processor 110 may calculate a difference between a signal intensity of $T_1$ and a signal intensity of $T_2$. Herein, the difference will be referred to as K1.

In operation 2003, the processor 110 may compare K1 and a pre-designated value (K0). For example, K0 may be close to 0. For example, when K1 has a range from 0 to 255, K0 may have a range from 1 to 10.

When K1 is less than K0 as a result of the comparing, the processor 110 proceeds to operation 2005, and otherwise, proceeds to operation 2007.

When the processor 110 proceeds to operation 2005, the processor 110 may determine that the camera module 191 is in focus. According to an embodiment of the present disclosure, thereafter, the processor 110 may display information indicating that the camera module 191 is in focus on the display 160 or may output the information through the speaker 182.

When the processor 110 proceeds to operation 2007, the processor 110 may determine that the camera module 191 is out of focus. Accordingly, according to an embodiment of the present disclosure, the processor 110 may move the lens of the camera module 191 based on K1. For example, the processor 110 may detect a moving distance of the lens corresponding to K1 using a table listing the relationship between the phase difference and the lens movement, and move the lens of the camera module 191 as long as the detected moving distance.

Figure 21:
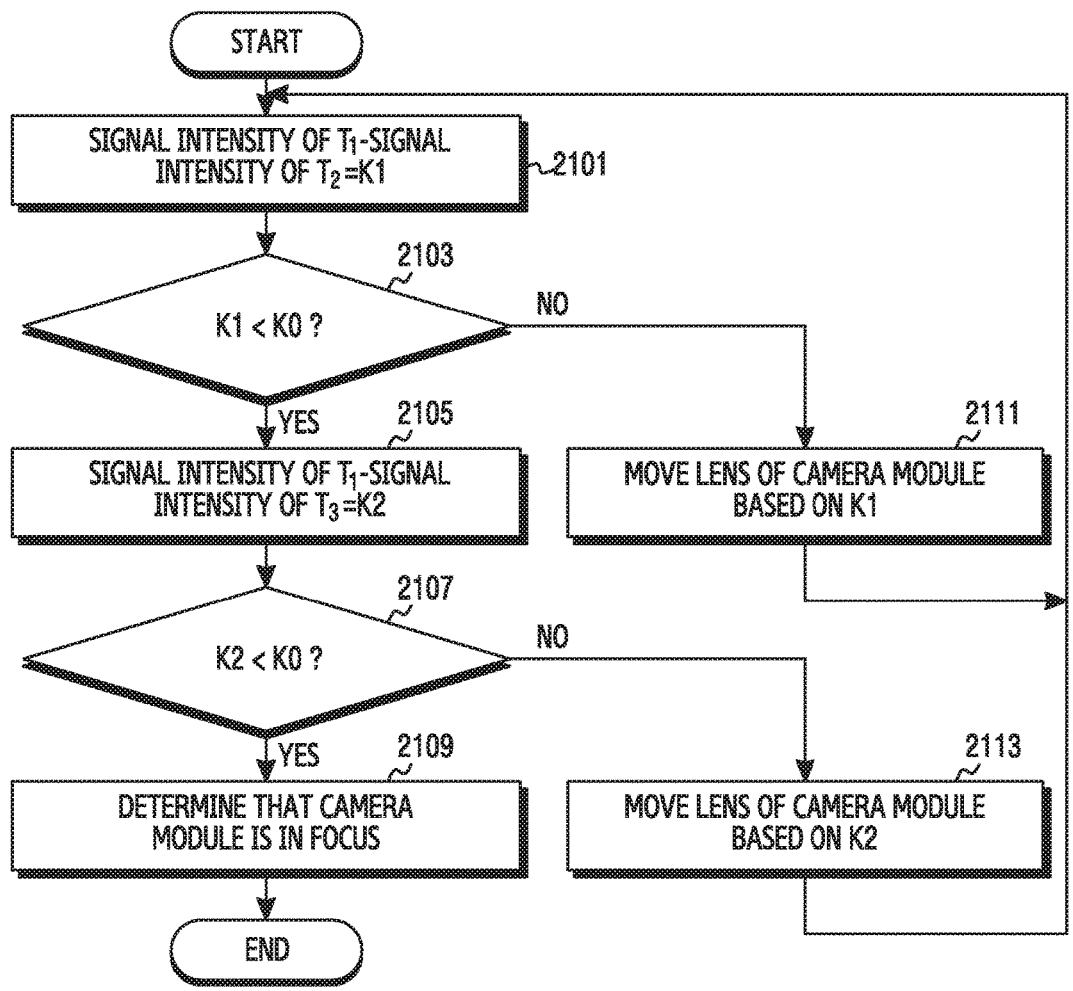
FIG. 21 illustrates a flowchart for adjusting a focus of a camera module in an electronic device according to an embodiment of the present disclosure.

FIG. 21 illustrates a flowchart for performing an auto focusing function to automatically adjust the focus of the camera module in the electronic device according to a second embodiment of the present disclosure. For the sake of easy explanation of the present disclosure, it is assumed in the second embodiment that the pixel includes at least four photodiodes, a transparent filter area is stacked on at least three of the four photodiodes, at least a pair of photodiodes of the three photodiodes is arranged in the horizontal direction, and at least a pair of photodiodes is arranged in the vertical direction.

Referring to FIG. 21, in operation 2101, the processor 110 may calculate a first difference between a signal intensity of $T_1$ and a signal intensity of $T_2$. Herein, the first difference will be referred to as K1.

In operation 2103, the processor 110 may compare K1 and a pre-designated value (K0). For example, K0 may be close to 0. For example, when K1 has a range from 0 to 255, K0 may have a range from 1 to 10.

When K1 is less than K0 as a result of the comparing, the processor 110 proceeds to operation 2105, and otherwise, proceeds to operation 2111.

When the processor 110 proceeds to operation 2111, the processor 110 may determine that the camera module 191 is out of focus. According to an embodiment of the present disclosure, thereafter, the processor 110 may move the lens of the camera module 191 based on K1. For example, the processor 110 may detect a moving distance of the lens corresponding to K1 using a table listing the relationship between the phase difference and the lens movement, and move the lens of the camera module 191 as long as the detected moving distance.

When the processor 110 proceeds to operation 2105, the processor 110 may calculate a second difference between the signal intensity of $T_1$ and a signal intensity of $T_3$. Herein, the second difference will be referred to as K2.

In operation 2107, the processor 110 may compare K2 and the pre-designated value (K0). When K2 is less than K0 as a result of the comparing, the processor 110 proceeds to operation 2109, and otherwise, the processor 110 proceeds to operation 2113.

When the processor 110 proceeds to operation 2113, the processor 110 may determine that the camera module 191 is out of focus. According to an embodiment of the present disclosure, thereafter, the processor 110 may move the lens of the camera module 191 based on K2. For example, the processor 110 may detect a moving distance of the lens corresponding to K2 using the table listing the relationship between the phase difference and the lens movement, and move the lens of the camera module 191 as long as the detected moving distance.

When the processor 110 proceeds to operation 2109, the processor 110 may determine that the camera module 191 is in focus. According to an embodiment of the present disclosure, thereafter, the processor 110 may display information indicating that the camera module 191 is in focus on the display 160 or may output the information through the speaker 182.

Figure 22:
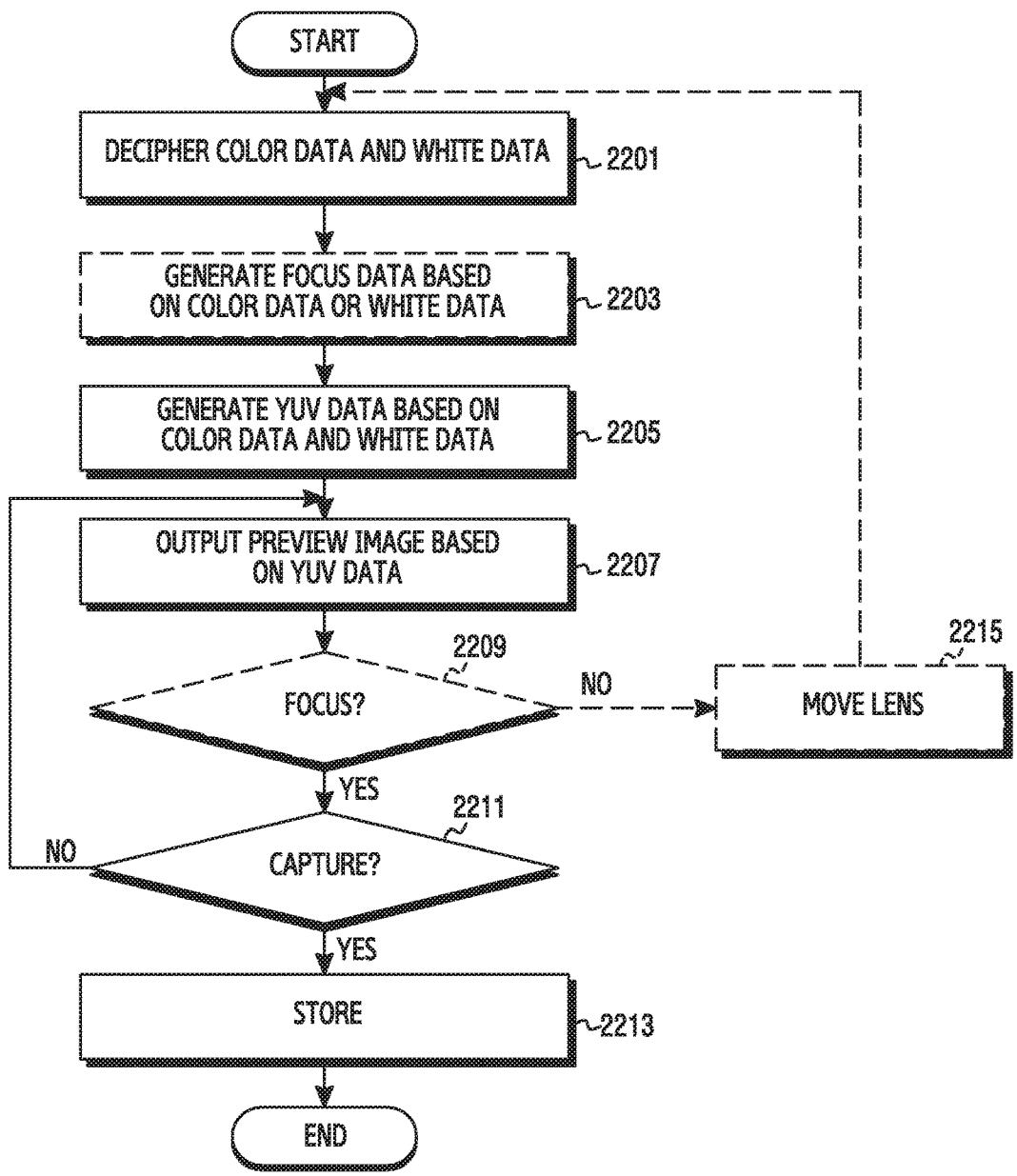
FIG. 22 illustrates a flowchart for storing an image in an electronic device according to an embodiment of the present disclosure.

FIG. 22 illustrates a flowchart for storing and outputting an image in the electronic device according to various embodiments of the present disclosure.

Referring to FIG. 22, in operation 2201, the processor 110 may decipher color information. For example, the color information may include color data (for example, color information or primary color information) and white data (for example, brightness information).

In operation 2203, the processor 110 may generate focus data (for example, phase difference information) based on the color data and the white data.

In operation 2205, the processor 110 may generate YUV data based on the color data and the white data. In operation 2207, the processor 110 may output a preview image through the display 160 based on the YUV data.

In operation 2209, the processor 110 may determine whether the camera module 191 is in focus or not based on the phase difference information. As a result of the determining, when the camera module 191 is in focus, the processor 110 proceeds to operation 2211, and otherwise, proceeds to operation 2215.

When the processor 110 proceeds to operation 2215, the processor 110 may move the lens of the camera module 191 based on the phase difference information.

When the processor 110 proceeds to operation 2211, the processor 110 may determine whether there is a request for image capturing. For example, the image capturing refers to picking up an image of a subject or photographing the subject using a camera. As a result of the determining, when there is the request for image capturing, the processor 110 may proceed to operation 2213, and otherwise, proceed to operation 2207.

When the processor 110 proceeds to operation 2213, the processor 110 may generate an image through the camera module 191 and store the image in the memory 130.

The flowchart of FIG. 22 may change the order of operations or omit some operations according to various embodiments. According to an embodiment of the present disclosure, operation 2205 may precede operation 2203. According to an embodiment of the present disclosure, operations 2203, 2209, and 2215 may be omitted.

According to various embodiments of the present disclosure, an image sensor may include a plurality of pixels, and at least one pixel of the plurality of pixels may include: a micro lens; a filter which includes a first area for filtering a first color signal from a light signal transmitted through the micro lens, and a second area for filtering a second color signal from the transmitted signal; and a first photodiode for converting the first color signal into an electric signal, and a second photodiode for converting the second color signal into an electric signal.

According to various embodiments of the present disclosure, at least two sides of the first area may be connected with at least two sides of the second area.

According to various embodiments of the present disclosure, the first area may be nearly colorless.

According to various embodiments of the present disclosure, the second area may be at least one of a red (R) filter, a green (G) filter, or a blue (B) filter.

According to various embodiments of the present disclosure, the filter may consist of only the first area and the second area which includes one of red (R) filter, green (G) filter, or blue (B) filter.

According to various embodiments of the present disclosure, at least part of one of the first area and the second area (for example, the color filter area 609) may be enclosed by the other area of the first area and the second area (for example, the transparent filter area 607).

According to various embodiments of the present disclosure, the first area may include first and second transparent filter areas (for example, the transparent filter areas 747, 749), and the second area (for example, the color filter area 751) may be disposed between the first and the second transparent filter areas.

According to various embodiments of the present disclosure, one of the first area and the second area may be disposed on an upper end of the other area of the first area and the second area.

According to various embodiments of the present disclosure, the first area may include first and second transparent filter areas (for example, the transparent filter areas 827, 829), and the second area may include first and second color filter areas (for example, the color filter areas 831, 833), and the first transparent filter area and the first color filter area may be symmetrical to the second transparent filter area and the second color filter area with reference to a single axis (for example, a vertical (y) axis).

According to various embodiments of the present disclosure, the first photodiode and the second photodiode may have similar sizes.

An electronic device according to various embodiments may include: an image sensor including a plurality of pixels; and a processor functionally connected with the image sensor, and at least one pixel of the plurality of pixels may include: a micro lens; a filter including a first area for filtering a first color signal from a light signal transmitted through the micro lens, and a second area for filtering a second color signal from the transmitted signal; and a first photodiode for converting the first color signal into an electric signal, and a second photodiode for converting the second color signal into an electric signal, and the processor may generate brightness information and color information based on at least the first color signal and the second color signal which are converted into the electric signals, and output an image corresponding to the brightness information and the color information.

According to various embodiments of the present disclosure, one of the first area and the second area may be enclosed by the other area of the first area and the second area.

According to various embodiments of the present disclosure, the second area may include a first color filter area and a second color filter area, and the first area may be disposed between the first and second color filter areas.

According to various embodiments of the present disclosure, the first area may include a first transparent filter area and a second transparent filter area, and the second area may include a first color filter area and a second color filter area, and the first transparent filter area (for example, the transparent filter area 849) is located on a diagonal line from the second transparent filter area (for example, the transparent filter area 851), and the first color filter area (for example, the color filter area 847) is located on a diagonal line from the second color filter area (for example, the color filter area 853).

According to various embodiments of the present disclosure, the processor may control auto focusing using the brightness information.

According to various embodiments of the present disclosure, the processor may process the brightness information and the color information and convert the brightness information and the color information into YUV data.

According to various embodiments of the present disclosure, the processor may generate phase difference information based on at least the brightness information, and control a function of the electronic device using the phase difference information.

A signal processing method according to various embodiments includes: receiving a light signal through a single micro lens included in at least one pixel included in an image sensor; filtering a white signal and a color signal from the light signal through a filter including a first area and a second area; converting the white signal and the color signal into electric signals through a plurality of photodiodes; and outputting an image corresponding to brightness information and color information which are determined based on the electric signals through a display.

According to various embodiments of the present disclosure, the signal processing method may further include generating phase difference information based on at least the brightness information, and adjusting a lens location of a camera unit according to the phase difference information.

According to various embodiments of the present disclosure, the signal processing method may further include generating image 3D information based on at least the brightness information, and generating a 3D image based on at least the image 3D information.

The image sensor and the signal processing method thereof according to various embodiments of the present disclosure can reduce a loss in the sensitivity of light by receiving light of diverse wavelengths.

The image sensor and the signal processing method thereof according to various embodiments of the present disclosure can provide a clear image even when a background for photographing has low illumination, by receiving light of almost all wavelengths.

Further, the 'module' may be provided as a non-transitory computer-readable storage media storing one or more programs (or programming modules and applications). For instance, the software may be implemented by an instruction stored in a non-transitory computer-readable storage media in a form of the programming module. The one or more programs may include instructions for enabling an electronic device to execute methods according to an embodiment stated in the claims and/or specification of the present disclosure. If the instruction is executed by one or more processors (e.g., the processor 120), the one or more processors may perform a function corresponding to the instruction. The non-transitory computer-readable storage media may be, for example, the memory 230. At least a part of the programming module may be, for example, implemented (e.g., executed) by the processor 210. At least a part of the programming module may include, for example, a module, a program, a routine, sets of instructions, or a process, etc. for performing one or more functions.

The non-transitory computer-readable recording media includes a magnetic media such as a hard disk, a floppy disk, and a magnetic tape, an optical media such as a compact disc-read only memory (CD-ROM) and a DVD, a Magneto-Optical Media such as a floptical disk, and a hardware device specially configured to store and perform a program instruction (e.g., a programming module) such as a ROM, a RAM, a flash memory, etc., an EEPROM, a magnetic disc storage device or an optical storage device of other form, and a magnetic cassette. Or, the program instruction may be stored in a memory constructed by a combination of some or all of them. Also, each construction memory may be also included in plural. Also, the program instruction includes not only a mechanical language code such as a code made by a compiler but also a high-level language code executable by a computer using an interpreter, etc.

Further, the program instruction may be stored in an attachable storage device accessible to an electronic device through a communication network such as the Internet, an intranet, a local area network (LAN), a wireless LAN (WLAN) and a storage area network (SAN) or a communication network constructed by a combination of them. This storage device may connect to the electronic device through an external port. Also, a separate storage device on the communication network may connect to a portable electronic device as well. The aforementioned hardware device may be configured to operate as one or more software modules so as to perform operations according to various embodiments of the present disclosure, and vice versa.

The module or programming module according to various embodiments of the present disclosure may include at least one or more of the aforementioned constituent elements, or omit some of the aforementioned constituent elements, or further include additional other constituent elements. Operations carried out by the module, the programming module or other constituent elements according to various embodiments of the present disclosure may be executed in a sequential, parallel, repeated or heuristic method. Also, some operations may be executed in different order or may be omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An image sensor, comprising:
   a plurality of pixels, wherein each of at least one pixel among the plurality of pixels comprises:
   a micro lens;
   a filter, wherein the filter comprises:
     a first area configured to filter a first color signal transmitted from the micro lens, wherein the first area consists of a transparent filter, and
     a second area configured to filter a second color signal from the light signal transmitted from the micro lens, wherein the second area consists of a color filter;
   a first photodiode for converting the first color signal into a first electric signal; and
   a second photodiode for converting the second color signal into a second electric signal,
   wherein the first area surrounds an entire area of the second area.

2. The image sensor of claim 1,
   wherein the first photodiode is located below the first area,
   wherein the second photodiode is located below the second area, and
   wherein the image sensor further comprises a barrier which is disposed between the first photodiode and the second photodiode.

3. The image sensor of claim 1,
   wherein the first area comprises a first transparent filter enclosing a half of the second area and a second transparent filter enclosing the other half of the second area.

4. The image sensor of claim 1,
   wherein the color filter comprises at least one of a red (R) filter, a green (G) filter, or a blue (B) filter.

5. The image sensor of claim 1,
   wherein the color filter comprises at least one of a red (R) filter, a green (G) filter, or a blue (B) filter, and
   wherein the second area comprises a transparent filter.

6. The image sensor of claim 1,
   wherein the first area consists of a first transparent filter and a second transparent filter, and
   wherein an area of the first transparent filter is symmetrical to an area of the second transparent filter with reference to an axis.

7. An image sensor comprising:
   a plurality of pixels, wherein each of at least one pixel among the plurality of pixels comprises:
   a micro lens;
   a filter, wherein the filter comprises:
     a first area configured to filter a first color signal from a light signal transmitted from the micro lens, and
     a second area configured to filter a second color signal from the light signal transmitted from the micro lens;
   a first photodiode for converting the first color signal into a first electric signal; and
   a second photodiode for converting the second color signal into a second electronic signal,
   wherein the first area consists of a first transparent filter and a second transparent filter parallel to the first transparent filter, and
   wherein the second area is disposed between the first transparent filter and the second transparent filter and in parallel with the first transparent filter and the second transparent filter, and the second area consists of a color filter.

8. The image sensor of claim 7,
   wherein the first photodiode is located below the first area,
   wherein the second photodiode is located below the second area, and
   wherein the image sensor further comprises a barrier which is disposed between the first photodiode and the second photodiode to distinguish between the first light signal and the second light signal.

9. The image sensor of claim 7, wherein the color filter comprises at least one of a red (R) filter, a green (G) filter, or a blue (B) filter.

10. The image sensor of claim 1, wherein an area of the first transparent filter is symmetrical to an area of the second transparent filter with reference to an axis.

11. An electronic device comprising:
an image sensor comprising a plurality of pixels; and
a processor functionally connected with the image sensor,
wherein each of at least one pixel of the plurality of pixels comprises:
　a micro lens;
　a filter, wherein the filter comprises;
　　a first area configured to filter a first color signal transmitted through the micro lens, the first area consisting of a transparent filter, and
　　a second area configured to filter a second color signal from the light signal transmitted from the micro lens,
　the second area consisting of a color filter;
　a first photodiode for converting the first color signal into an electric signal; and
　a second photodiode for converting the second color signal into an electric signal,
wherein the first area surrounds an entire area of the second area, and
wherein the processor is configured to generate brightness information and color information based on at least the first color signal and the second color signal which are converted into the electric signals, and output an image corresponding to the brightness information and the color information.

12. The electronic device of claim 11, wherein one of the first area and the second area is enclosed by another area of the first area and the second area.

13. The electronic device of claim 11,
wherein the second area comprises a first color filter area and a second color filter area, and
wherein the first area is disposed between the first and second color filter areas.

14. The electronic device of claim 11,
wherein the first area comprises a first transparent filter area and a second transparent filter area, and the second area comprises a first color filter area and a second color filter area, and
wherein the first transparent filter area is located on a diagonal line from the second transparent filter area, and the first color filter area is located on a diagonal line from the second color filter area.

15. The electronic device of claim 11, wherein the processor is configured to control auto focusing using the brightness information.

16. The electronic device of claim 11, wherein the processor is configured to process the brightness information and the color information and convert the brightness information and the color information into YUV data.

17. The electronic device of claim 11, wherein the processor is configured to:
generate phase difference information based on at least the brightness information, and
control a function of the electronic device using the phase difference information.

* * * * *